United States Patent
Haba et al.

(10) Patent No.: US 9,136,197 B2
(45) Date of Patent: Sep. 15, 2015

(54) IMPEDENCE CONTROLLED PACKAGES WITH METAL SHEET OR 2-LAYER RDL

(75) Inventors: Belgacem Haba, Saratoga, CA (US); Ellis Chau, San Jose, CA (US); Wael Zohni, San Jose, CA (US); Philip Damberg, Cupertino, CA (US); Richard Dewitt Crisp, Hornitos, CA (US)

(73) Assignee: Tessera, Inc., San Jose, CA (US)

( * ) Notice: Subject to any disclaimer, the term of this patent is extended or adjusted under 35 U.S.C. 154(b) by 148 days.

(21) Appl. No.: 13/472,081

(22) Filed: May 15, 2012

(65) Prior Publication Data

US 2012/0313228 A1 Dec. 13, 2012

Related U.S. Application Data

(63) Continuation-in-part of application No. 12/883,821, filed on Sep. 16, 2010, now Pat. No. 8,786,083.

(51) Int. Cl.
*H01L 23/495* (2006.01)
*H01L 23/31* (2006.01)
(Continued)

(52) U.S. Cl.
CPC .......... *H01L 23/3128* (2013.01); *H01L 23/552* (2013.01); *H01L 24/06* (2013.01);
(Continued)

(58) Field of Classification Search
CPC ................. H01L 23/13; H01L 23/552; H01L 2224/1134
USPC .......... 438/106–110, 123; 257/668, 777, 784, 257/E23.06, E23.038, E23.04
See application file for complete search history.

(56) References Cited

U.S. PATENT DOCUMENTS

| 4,680,613 A | 7/1987 | Daniels et al. |
| 4,980,753 A | 12/1990 | Dunaway et al. |

(Continued)

FOREIGN PATENT DOCUMENTS

| CN | 101410974 A | 4/2009 |
| EP | 0915504 A1 | 5/1999 |

(Continued)

OTHER PUBLICATIONS

Taiwan Office Action for Application No. 099107377 dated Feb. 18, 2013.

(Continued)

*Primary Examiner* — Brook Kebede
(74) *Attorney, Agent, or Firm* — Lerner, David, Littenberg, Krumholz & Mentlik, LLP

(57) ABSTRACT

A microelectronic assembly includes an interconnection element, a conductive plane, a microelectronic device, a plurality of traces, and first and second bond elements. The interconnection element includes a dielectric element, a plurality of element contacts, and at least one reference contact thereon. The microelectronic device includes a front surface with device contacts exposed thereat. The conductive plane overlies a portion of the front surface of the microelectronic device. Traces overlying a surface of the conductive plane are insulated therefrom and electrically connected with the element contacts. The traces also have substantial portions spaced a first height above and extending at least generally parallel to the conductive plane, such that a desired impedance is achieved for the traces. First bond element electrically connects the at least one conductive plane with the at least one reference contact. Second bond elements electrically connect device contacts with the traces.

35 Claims, 17 Drawing Sheets

(51) Int. Cl.
*H01L 23/552* (2006.01)
*H01L 23/00* (2006.01)
*H01L 25/065* (2006.01)
*H01L 23/13* (2006.01)
*H01L 23/498* (2006.01)

(52) U.S. Cl.
CPC .......... *H01L 24/49* (2013.01); *H01L 25/0657* (2013.01); *H01L 23/13* (2013.01); *H01L 23/49816* (2013.01); *H01L 24/29* (2013.01); *H01L 24/45* (2013.01); *H01L 24/48* (2013.01); *H01L 2224/02311* (2013.01); *H01L 2224/02313* (2013.01); *H01L 2224/02375* (2013.01); *H01L 2224/02379* (2013.01); *H01L 2224/05554* (2013.01); *H01L 2224/06156* (2013.01); *H01L 2224/32145* (2013.01); *H01L 2224/32225* (2013.01); *H01L 2224/45015* (2013.01); *H01L 2224/45144* (2013.01); *H01L 2224/45147* (2013.01); *H01L 2224/4824* (2013.01); *H01L 2224/48091* (2013.01); *H01L 2224/48095* (2013.01); *H01L 2224/48227* (2013.01); *H01L 2224/48235* (2013.01); *H01L 2224/49175* (2013.01); *H01L 2224/73215* (2013.01); *H01L 2224/73265* (2013.01); *H01L 2225/0651* (2013.01); *H01L 2225/06558* (2013.01); *H01L 2924/014* (2013.01); *H01L 2924/01005* (2013.01); *H01L 2924/01029* (2013.01); *H01L 2924/01033* (2013.01); *H01L 2924/01047* (2013.01); *H01L 2924/01079* (2013.01); *H01L 2924/07802* (2013.01); *H01L 2924/15311* (2013.01); *H01L 2924/19107* (2013.01); *H01L 2924/3011* (2013.01); *H01L 2924/30107* (2013.01)

(56) References Cited

U.S. PATENT DOCUMENTS

| | | |
|---|---|---|
| 5,028,983 A | 7/1991 | Bickford et al. |
| 5,065,282 A | 11/1991 | Polonio |
| 5,343,074 A | 8/1994 | Higgins, III et al. |
| 5,394,010 A | 2/1995 | Tazawa et al. |
| 5,468,999 A | 11/1995 | Lin et al. |
| 5,471,151 A | 11/1995 | DiFrancesco |
| 5,523,621 A | 6/1996 | Kikuchi |
| 5,552,631 A | 9/1996 | McCormick |
| 5,606,196 A | 2/1997 | Lee et al. |
| 5,638,596 A | 6/1997 | McCormick |
| 5,639,989 A | 6/1997 | Higgins, III |
| 5,835,988 A | 11/1998 | Ishii |
| 5,880,403 A | 3/1999 | Czajkowski et al. |
| 6,001,671 A | 12/1999 | Fjelstad |
| 6,326,678 B1 | 12/2001 | Karnezos et al. |
| 6,445,594 B1 | 9/2002 | Nakagawa et al. |
| 6,476,506 B1 | 11/2002 | O'Connor et al. |
| 6,518,659 B1 | 2/2003 | Glenn |
| 6,538,336 B1 | 3/2003 | Secker et al. |
| 6,552,417 B2 | 4/2003 | Combs |
| 6,667,546 B2 | 12/2003 | Huang et al. |
| 6,770,822 B2 | 8/2004 | Pasternak et al. |
| 6,812,580 B1 | 11/2004 | Wenzel et al. |
| 7,166,495 B2 | 1/2007 | Ball |
| 7,205,651 B2 | 4/2007 | Do et al. |
| 7,217,997 B2 | 5/2007 | Wyland |
| 7,303,113 B2 | 12/2007 | Kwark et al. |
| 7,450,110 B2 | 11/2008 | Shahoian et al. |
| 7,456,505 B2 | 11/2008 | Gospodinova et al. |
| 7,466,021 B2 | 12/2008 | Fjelstad |
| 7,468,560 B2 | 12/2008 | Guengerich et al. |
| 7,528,011 B2 | 5/2009 | Yano et al. |
| 7,537,962 B2 | 5/2009 | Jang et al. |
| 7,550,842 B2 | 6/2009 | Khandros et al. |
| 7,723,852 B1 | 5/2010 | Kim et al. |
| 7,727,801 B2 | 6/2010 | Saran |
| 7,768,135 B1 | 8/2010 | St. Amand et al. |
| 7,843,021 B2 | 11/2010 | Zhe et al. |
| 7,855,463 B2 | 12/2010 | Brox et al. |
| 7,875,985 B2 | 1/2011 | Hiller et al. |
| 7,923,851 B2 | 4/2011 | Haba et al. |
| 8,026,129 B2 | 9/2011 | Cablao et al. |
| 8,222,725 B2 | 7/2012 | Haba et al. |
| 8,237,250 B2 | 8/2012 | Chang Chien et al. |
| 8,243,465 B2 | 8/2012 | Itaya et al. |
| 8,253,258 B2 | 8/2012 | Sonobe et al. |
| 8,294,249 B2 | 10/2012 | Pilling et al. |
| 8,531,043 B2 | 9/2013 | Ha et al. |
| 8,575,766 B2 | 11/2013 | Haba et al. |
| 2001/0015490 A1 | 8/2001 | Lee |
| 2003/0090001 A1 | 5/2003 | Beatson et al. |
| 2004/0164389 A1 | 8/2004 | Lee |
| 2004/0238939 A1* | 12/2004 | Wu .................. 257/691 |
| 2005/0006742 A1 | 1/2005 | Sugiyama et al. |
| 2005/0045378 A1* | 3/2005 | Heng et al. ............ 174/260 |
| 2005/0098870 A1 | 5/2005 | Thomas et al. |
| 2005/0116013 A1 | 6/2005 | Kwark et al. |
| 2006/0049505 A1 | 3/2006 | Wyland |
| 2006/0102992 A1 | 5/2006 | Kwon et al. |
| 2006/0125079 A1 | 6/2006 | Wyland et al. |
| 2006/0131742 A1 | 6/2006 | Tzu |
| 2006/0145308 A1 | 7/2006 | Floyd et al. |
| 2006/0175712 A1 | 8/2006 | Lyn et al. |
| 2006/0180916 A1 | 8/2006 | Wyland |
| 2007/0007644 A1* | 1/2007 | Zhao et al. .......... 257/707 |
| 2007/0034674 A1 | 2/2007 | Mii et al. |
| 2007/0105272 A1 | 5/2007 | Lee et al. |
| 2007/0148821 A1 | 6/2007 | Do et al. |
| 2007/0170601 A1 | 7/2007 | Miyaki et al. |
| 2007/0284716 A1 | 12/2007 | Vindasius et al. |
| 2008/0088012 A1 | 4/2008 | Ohkawa |
| 2008/0111248 A1 | 5/2008 | Foong et al. |
| 2009/0032973 A1 | 2/2009 | Sasaki et al. |
| 2009/0057862 A1* | 3/2009 | Ha et al. .............. 257/686 |
| 2009/0256266 A1 | 10/2009 | Lao et al. |
| 2010/0230828 A1 | 9/2010 | Haba et al. |
| 2010/0232128 A1 | 9/2010 | Haba et al. |
| 2010/0270667 A1 | 10/2010 | Tong et al. |
| 2012/0068317 A1 | 3/2012 | Haba et al. |
| 2012/0068338 A1 | 3/2012 | Haba et al. |
| 2012/0068361 A1 | 3/2012 | Haba |

FOREIGN PATENT DOCUMENTS

| | | |
|---|---|---|
| EP | 1770777 A2 | 4/2007 |
| JP | 06-268100 A | 9/1994 |
| JP | 7058138 A | 3/1995 |
| JP | 9-027512 A | 1/1997 |
| JP | 2000021926 A | 1/2000 |
| JP | 2000332160 A | 11/2000 |
| JP | 2001007140 A | 1/2001 |
| JP | 2001339016 A | 12/2001 |
| JP | 2004112143 A | 4/2004 |
| JP | 2006216823 A | 8/2006 |
| KR | 100270817 B1 | 11/2000 |
| KR | 20050002659 A | 1/2005 |
| KR | 100702970 A | 1/2007 |
| KR | 100935854 B1 | 1/2010 |
| KR | 100950511 B1 | 3/2010 |
| WO | 2005010989 A1 | 2/2005 |
| WO | 2008/008948 A2 | 1/2008 |
| WO | 2010020836 A1 | 2/2010 |

OTHER PUBLICATIONS

International Search Report Application No. PCT/US2010/027135, dated Aug. 30, 2011.
International Search Report, PCT/US2010/027141, dated Jan. 6, 2012.
Partial International Search Report and Invitation to Pay Additional Fees, PCT/US2010/027135, dated Mar. 21, 2011.
Partial International Search Report and Invitation to Pay Additional Fees, PCT/US2010/027141, dated Jan. 27, 2011.

(56) References Cited

OTHER PUBLICATIONS

U.S. Appl. No. 12/883,556.
U.S. Appl. No. 12/883,612.
U.S. Appl. No. 12/883,811.
U.S. Appl. No. 12/883,821.
Japanese Office Action for Application No. 2011-554234 dated Jul. 12, 2013.
Chinese Office Action for Application No. 201080020828.3 dated Jul. 29, 2013.
Chinese Office Action for Application No. 201080020851.2 dated Nov. 28, 2013.
Japanese Office Action for Application No. 2011-554232 dated Feb. 4, 2014.
Chinese Office Action for Application No. 201080020828.3 dated Mar. 3, 2014.

* cited by examiner

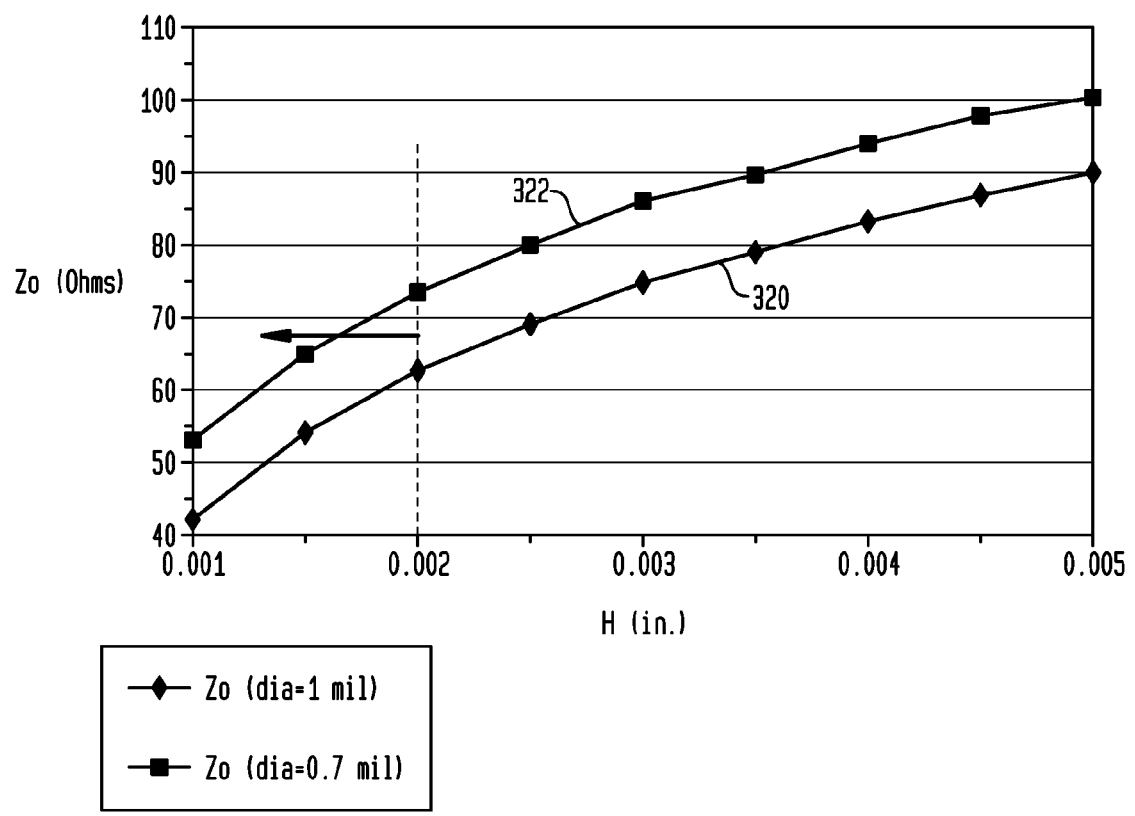

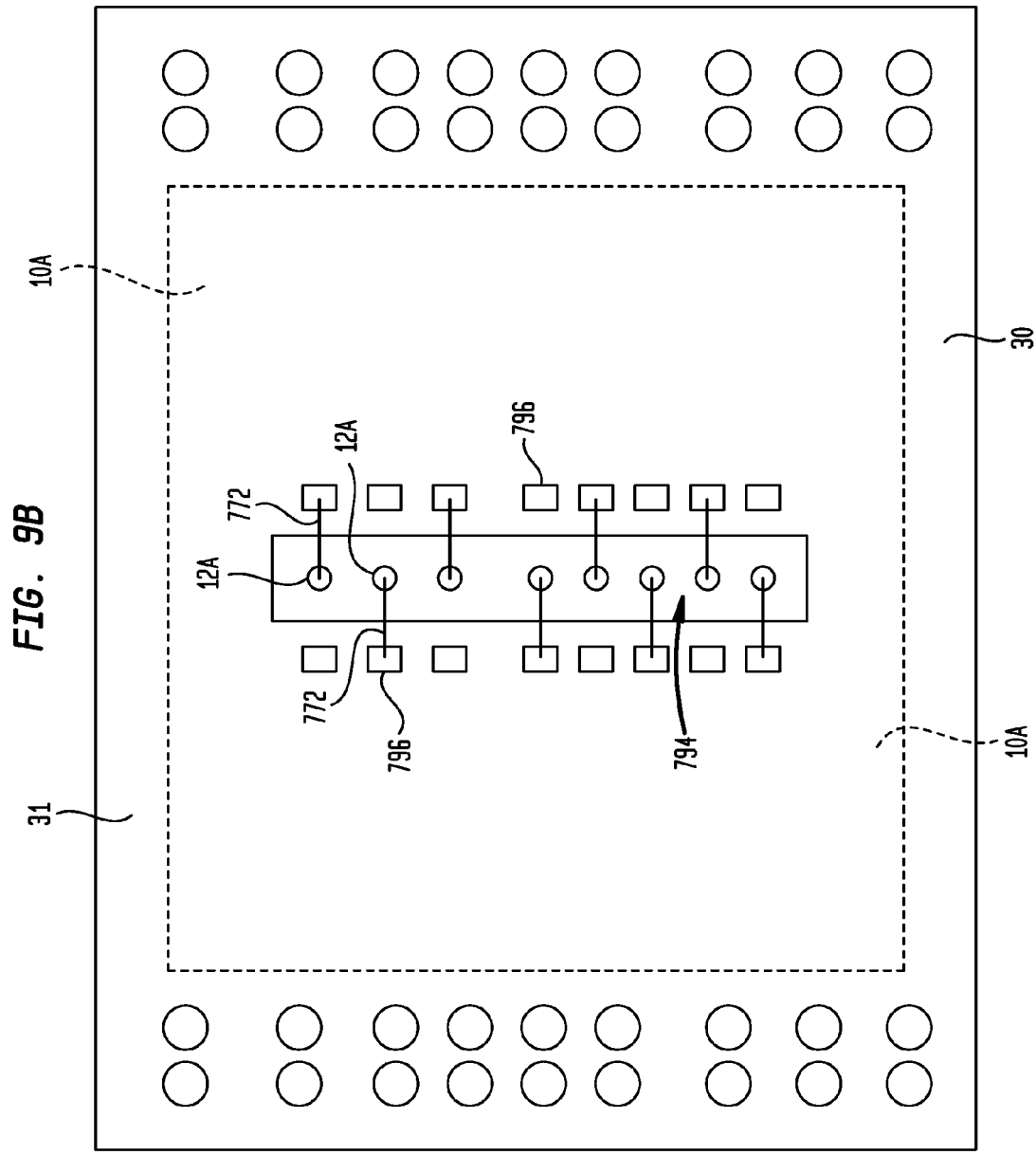

IMPEDENCE CONTROLLED PACKAGES WITH METAL SHEET OR 2-LAYER RDL

CROSS-REFERENCE TO RELATED APPLICATIONS

The present application is a continuation-in-part of U.S. Pat. No. 12/883,821, filed on Sep. 16, 2010, the disclosure of which is incorporated herein by reference.

BACKGROUND OF THE INVENTION

Microelectronic chips are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g., a circuit in an electronic product such as a computer or a cell phone) by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die has been formed, the wafer is subjected to a number of additional process steps to form the package structure on the wafer, and the wafer is then diced to free the individually packaged die. Wafer level processing can be an efficient fabrication method because the footprint of each die package may be made identical, or nearly identical, to the size of the die itself, resulting in very efficient utilization of area on the printed circuit board to which the packaged die is attached.

A common technique for forming electrically conductive connections between a microelectronic chip and one or more other electronic components is through wirebonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

BRIEF SUMMARY OF THE INVENTION

As discussed in U.S. application Ser. No. 12/722,784, filed on Mar. 12, 2010 and U.S. application Ser. No. 12/722,799, filed on Mar. 12, 2010, the disclosures of which are incorporated herein by reference, as well as U.S. application entitled Metal Can Impedance Control Structure, filed by the same assignee herein, on Sep. 16, 2010, the disclosure of which is also incorporated by reference, one of the problems with wire-bond technology inventors have recognized that one of the problems with wirebond technology is that electromagnetic transmissions along a wire can extend into space surrounding the wire, inducing currents in nearby conductors and causing unwanted radiation and detuning of the line. Wirebonds generally are also subject to self-inductances and are subject to external noise (e.g. from nearby electronic components). In the end, this creates electrical impedance problems. These problems can become more serious as the pitch between contacts on microelectronic chips and other electronic components becomes smaller, as the chips operate at higher frequencies, and as the use of multiple raw pads becomes more common.

Various structures and techniques for manufacturing are described herein for a microelectronic assembly. In one embodiment, a microelectronic assembly includes an interconnection element, a microelectronic device, a plurality of raised conductive elements, a surface conductive element, and a bond element. The interconnection element may be a dielectric element that has a plurality of element contacts and at least one reference contact on the surface of the interconnection element. The microelectronic device overlies the dielectric element and has a rear surface overlying the dielectric element, an opposed front surface with device contacts exposed thereat, and at least one surface conductive element attached to the front surface. A plurality of raised conductive elements may connect the device contacts with the element contacts. The raised conductive elements may have substantial portions spaced a first height above and extending at least generally parallel to at least one surface conductive element, such that a desired impedance may be achieved for the raised conductive elements. A bond element may electrically connect at least one surface conductive element with at least one reference contact that may be connectable to a source of reference potential.

In one embodiment, substantial portions of each of the conductive elements may be a length that is at least 25% of the total length of each conductive element. Alternatively, the substantial portion of each conductive element may be at least 1 millimeter. Additionally, the first and second edges may meet at a corner of the microelectronic device.

In another embodiment, the bond element may be a first bond element extending beyond a first edge of the microelectronic device. There may also be a second bond element extending beyond a second edge of the microelectronic device and connecting the at least one surface conductive element to a second reference contact of the interconnection element. Alternatively, the bond element may be positioned between at least two of the plurality of raised conductive elements. In yet another alternative, the bond element may extend in a direction transverse to the direction in which at least some of the plurality of raised conductive elements extend.

In another embodiment, at least one of the plurality of raised conductive elements extends beyond a first edge of the microelectronic device and the bond element extends beyond the first edge. The raised conductive elements may include bond wires. Alternatively, all of the conductive elements are bond wires.

In one embodiment, the surface conductive element may be a power plane, a ground plane, or a combination of a power and ground plane. The surface conductive element may also be connectable to a fixed voltage source. Alternatively, the surface conductive element may further reduce an inductance in the electrical connection between the device contact and a source of fixed voltage.

In another embodiment, the surface conductive element may be comprised of multiple sections, wherein at least a first section may be a power plane and a second section may be a ground plane. The first section may be adjacent one edge of the device contacts and the second section may be adjacent the opposed edge of the device contacts. Alternatively, the first and second sections may be adjacent the same edge of the device contacts.

In one embodiment, the first section may be further comprised of a first portion and a second portion, wherein device contacts extend therebetween. In one embodiment, there may be another bond element that electrically connects the first and second portions of the first section. Additionally, the second section may also be further comprised of a first portion and a second portion, and the device contacts may also further extend therebetween. Another bond element may be used to electrically connect the first and second portions of the second section.

In still another embodiment, another bond element may be used to electrically connect device contacts with the first portion or second portion of at least one of the first section and second sections. Alternatively, another bond element may connect at least one device contact with at least one surface conductive element.

Turning now to another aspect of the presently disclosed embodiments, a microelectronic assembly includes an interconnection element having a face, a microelectronic device, a metal plane, and first and second bond elements. The microelectronic device may overly the face of the interconnection element and may have a plurality of first device contacts disposed the surface of the microelectronic device. An at least one second device contact may also be disposed at the surface and at least one trace may be deposited on the surface and electrically connected to the interconnection element. The at least one trace may electrically connect at least one of the first device contacts with the at least one second device contact. At least one first bond element electrically connects the at least one second device contact with at least one of the element contacts. At least one metal plane may be electrically connected to the interconnection element and attached to the microelectronic device at a height from the surface greater than a height of the at least one trace from the surface. The at least one metal plane may be connectable to a source of reference potential, such that a desired impedance may be achieved for the at least one trace. The at least one trace may have at least a substantial portion extending in a direction substantially parallel to a direction in which the metal plane extends. At least one bond element electrically connects the metal plane with a reference element of the interconnection element, which may be electrically connectable with a source of reference potential.

In one embodiment, the substantial portion of the at least one trace may be a length that is at least 25% of the total length of the at least one trace or have a length of at least 1 millimeter.

In one embodiment, the second bond element extends beyond a first edge of the microelectronic device, and the second bond element extends beyond a second edge of the microelectronic device. The first and second edges of the microelectronic device meet at a corner of the microelectronic device.

In one embodiment, the first bond element may be a plurality of first bond elements and the at least one second bond may be positioned between at least two of the plurality of first bond elements. Alternatively, the at least one second bond element extends in a direction transverse to the direction in which the at least one first bond element extends.

In one embodiment, the metal plane reduces an inductance in the electrical connection between the device contact and a source of fixed voltage. Alternatively, the metal plane may be a power plane, a ground plane, or a combination of a ground plane and a power plane. Additionally, the metal plane may be connectable to a fixed voltage source.

In another embodiment, the at least one first bond element or the at least one second bond element includes a bond wire. Alternatively, the at least one first bond element or the at least one second bond element may be a bond wire.

In one embodiment, the metal plane may be comprised of multiple sections, wherein at least one first section may be a power plane and a second section may be a ground plane. The first section may be adjacent one edge of the device contacts and the second section may be adjacent the opposed edge of the device contacts. Alternatively, the first and second sections may be adjacent the same edge of the device contacts. Device contacts may extend between each of the first portions, each of the second portions, or both the first and second sections.

A third bond element may additionally electrically connect the first and second portions of the first section. Alternatively, the third bond element may electrically connect the first and second portions of the second section. Additionally, the third bond element may electrically connect device contacts with the first portion or second portion of either or both the first section and second section. Furthermore, the third bond element may electrically connect device contacts with the first portion or second portion of at least one of the first section and second sections.

In another embodiment, at least one third bond element electrically connects at least one device contact with at least one surface conductive element. In still another embodiment, the at least one third bond element electrically connects the metal plane with a reference contact of the interconnection element.

In one embodiment, the microelectronic assembly includes a first microelectronic device, a second microelectronic device, and the reference conductor may be a first reference conductor. The first and second microelectronic devices have a plurality of third device contacts disposed at a surface remote from the first microelectronic device. At least one fourth device contact may be disposed at the surface, and at least one trace may extend along the surface and electrically connect at least one of the third device contacts with the at least one fourth device contact. The at least one second reference conductor may overlie the surface of the second microelectronic device at a height from the surface greater than a height of the at least one trace from the surface of the second microelectronic device. The at least one second reference conductor may be connectable to a source of reference potential, such that a desired impedance may be achieved for the at least one trace of the second microelectronic device. The second reference conductor has at least a substantial portion extending in a direction substantially parallel to a direction in which the at least one trace of the second microelectronic device extends.

In another aspect of the present invention, a microelectronic assembly includes an interconnection element, a microelectronic device, a conductive plane, a plurality of traces, contacts, and bond elements electrically connecting the components of the assembly. Interconnection element includes a dielectric element, a plurality of element contacts and at least one reference contact thereon. The microelectronic device may have a rear surface overlying the dielectric element and a front surface remote therefrom. Device contacts may be exposed at the front surface. A conductive plane can overlie a portion of the front surface and be insulated from the front surface of the microelectronic device. A plurality of traces overlying a surface of the conductive plane is insulated from the conductive plane. The traces are electrically connected with the element contacts and have substantial portions spaced a first height above and extending at least generally parallel to the conductive plane, such that a desired impedance is achieved for the traces. A first bond element may electrically connect the at least one conductive plane with the at least one reference contact. The at least one reference contact is connectable to a source of reference potential. A plurality of second bond elements may be used to electrically connect device contacts with the traces.

In one embodiment of this aspect, the surface of the conductive plane over which the traces extend is a surface facing away from the front surface of the microelectronic device.

In another embodiment, the substantial portion of each trace has a length that is at least 25% of the total length of each individual respective trace. Alternatively, substantial portions of the traces are lengths of at least 1 millimeter.

In another embodiment, the conductive plane is a power plane. Alternatively, the conductive plane is a ground plane. In yet another alternative embodiment, the conductive plane includes a first conductive plane being a power plane and a second conductive plane being a ground plane.

In another embodiment, the surface of the conductive element is comprised of multiple sections, wherein at least a first section is a power plane and a second section is a ground plane. The first section may be adjacent one edge of the device contacts and the second section may be adjacent the opposed edge of the device contacts. Alternatively, first and second sections are adjacent the same edge of the device contacts.

In another embodiment, the first section is comprised of a first portion and a second portion, and the device contacts extend between the first and second portions. Alternatively, the second section is comprised of a first portion and a second portion, and the device contacts extend between the first and second portions.

In another embodiment, the second section is comprised of a third portion and a fourth portion, and the device contacts extend between the third and fourth portions. The first and second portions of the first conductive plane are ground planes and the third and fourth portions of the second conductive plane are power planes. In such embodiment, the first and third portions provide ground and power connections for off-chip drivers, and the second and fourth portions providing ground and power connections for circuitry other than for the off-chip drivers.

In another embodiment, the conductive plane is connectable to a fixed voltage source.

In another embodiment, at least one third bond element electrically connects the first and second portions of the first section. Alternatively, at least one third bond element electrically connects the first and second portions of the second section.

In still another embodiment, at least one third bond element electrically connects device contacts with the first portion or second portion of at least one of the first section and second sections.

In yet another embodiment, at least one third bond element electrically connects at least one device contact with at least one conductive plane. Alternatively, the at least one third bond element electrically connecting the conductive plane with a reference contact of the interconnection element.

In another embodiment, an insulating layer may be positioned between the conductive plane and the plurality of traces. The insulating layer may be used to insulate the plurality of traces from the conductive plane. Alternatively, conductive vias extending through the insulating layer. The first bond element may be electrically connected to the at least one conductive plane through the conductive vias.

In yet another alternative embodiment, a ground connection may be connected to the conductive vias, and the first bond element may be electrically connected to the at least one conductive plane through the ground connection and conductive vias.

In still another alternative embodiment, there may be a second microelectronic device that has a rear surface and an opposed front surface with device contacts thereon. The rear surface of the second microelectronic device may be adjacent the rear surface of the first microelectronic device. The interconnection element further may further include an opening and the device contacts of the second microelectronic device may be exposed through the opening.

In another aspect of the present invention, the microelectronic assembly includes an interconnection element, a microelectronic device, traces, and bond wires electrically connecting the components of the microelectronic assembly. There is a dielectric element that has a plurality of element contacts and at least one reference contact on its surface. The microelectronic device may have a rear surface that overlies the dielectric element, and a front surface remote therefrom. The device contacts may be exposed at the front surface. A plurality of traces may overlie the microelectronic device. A conductive plane overlies a portion of the traces and is insulated therefrom. A first bond element electrically connects the at least one conductive plane with the at least one reference contact, wherein the at least one reference contact is connectable to a source of reference potential. A plurality of second bond elements is electrically connected to device contacts with the traces. The traces are electrically connected with the element contacts. Traces may have substantial portions spaced a fixed distance from the conductive plane and generally parallel to the conductive plane, such that a desired impedance is achieved for the traces.

In an embodiment of this aspect of the invention, the surface of the conductive plane is a surface facing away from the front surface of the microelectronic device.

In another embodiment, the substantial portion of each trace has a length that is at least 25% of the total length of each individual respective trace. Alternatively, substantial portions of the traces are lengths of at least 1 millimeter.

In another embodiment, the conductive plane is a power plane. Alternatively, the conductive plane is a ground plane. In yet another alternative embodiment, the conductive plane includes a first conductive plane being a power plane and a second conductive plane being a ground plane.

In still another embodiment of this aspect of the invention, the microelectronic device is a first microelectronic device and the assembly further includes a second microelectronic device. The second microelectronic device may have a front surface facing the substrate and rear surface facing the first microelectronic device. The microelectronic device may have contacts exposed at the front surface thereof.

In accordance with another aspect of the present invention, a method of forming a microelectronic assembly includes bonding a subassembly that includes a conductive plane, a plurality of traces and a dielectric layer separating the plane from the traces, to a front surface of a microelectronic element; forming first wirebonds electrically connecting traces on the subassembly with the device contacts; and forming second wirebonds electrically connecting the traces with element contacts on an interconnection element disposed below a rear surface that is opposite a front face of the microelectronic element.

In an alternative embodiment, contacts on the front surface of the microelectronic element are exposed beyond an edge of the subassembly.

In another embodiment, an outer edge of the subassembly is a peripheral edge bounding a major surface of the subassembly.

In still another embodiment, the subassembly further includes an aperture through which the device contacts are exposed, and an interior edge of the subassembly is an edge of the aperture. Alternatively, the subassembly may be a circuit panel.

In another embodiment, the dielectric layer is selected from a polymeric material or a composite material.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 1C is a diagram graphing characteristic impedance Z0 relative to separation height H for different diameters of bond wire, in accordance with an embodiment.

FIG. 9B is a bottom plan view of the embodiment shown in FIG. 9.

DETAILED DESCRIPTION

Figure 1:
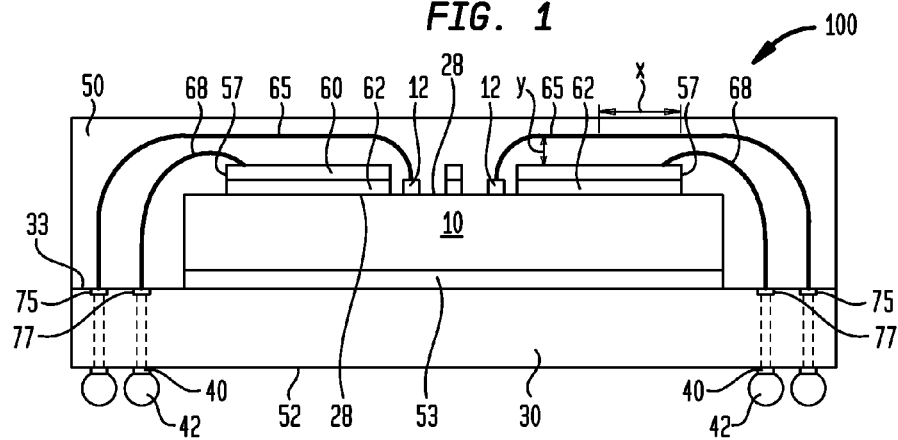
FIG. 1 is a sectional view of a microelectronic assembly.
Figure 1A:
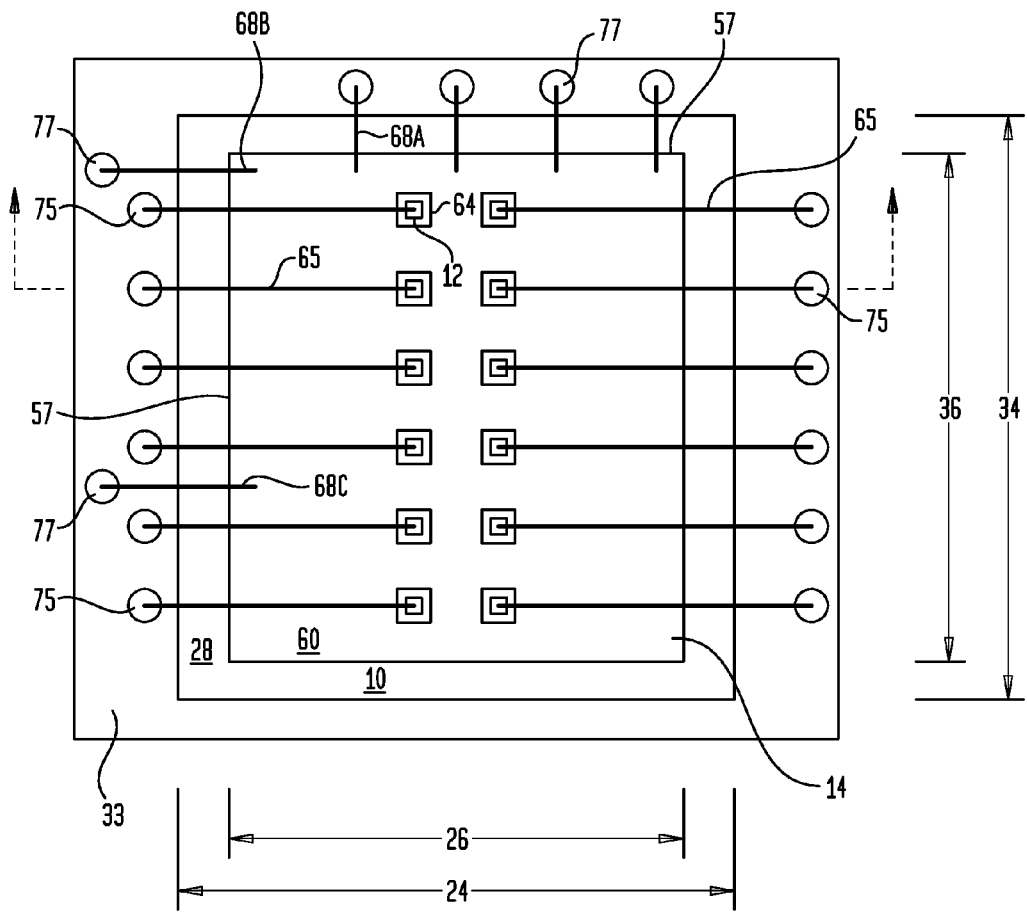
FIG. 1A is a plan view of the microelectronic assembly shown in FIG. 1.
Figure 1B:
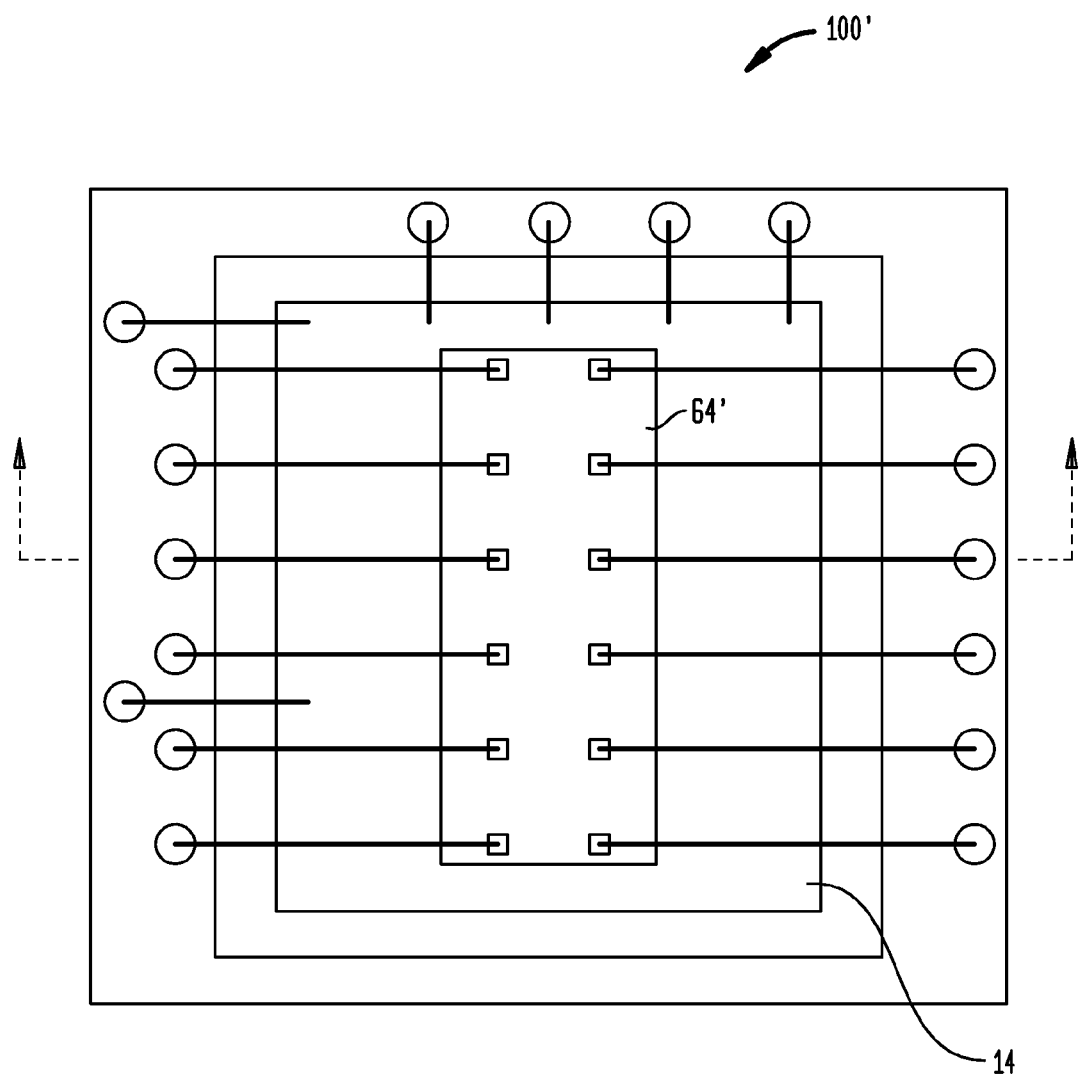
FIG. 1B is a top plan view of an alternative embodiment of the microelectronic assembly shown in FIG. 1.

FIG. 1 is a sectional view illustrating a microelectronic assembly 100 including microelectronic device 10 and a conductive plane 60 electrically connected with the interconnection element 30. FIG. 1A is a plan view from above the surface 28 and looking towards the surface towards contacts 12. As seen in FIGS. 1A-B, the conductive plane 60 can include openings 64 which expose individual ones of the contacts 12. Alternatively, as shown in the microelectronic assembly 100' of FIG. 1B, the conductive plane 60 can include one or more larger openings 64' which expose some or all of the contacts of the microelectronic device.

In one embodiment, microelectronic assembly 100 includes a microelectronic device 10 that is bonded the interconnection element by use of a bonding material, such as a dielectric adhesive 53. The microelectronic device may be further conductively connected to interconnection element 30 through a first plurality of device wires 65 and also conductively connected to a conductive plane 60 through a second plurality of reference wires 68. Microelectronic device 10 can be a single "bare", i.e., unpackaged die, e.g., a semiconductor chip having microelectronic circuitry thereon. In alternative embodiments, microelectronic device 10 can include a packaged semiconductor die. Initially, a plurality of contacts 12 are exposed at a surface 28 of the microelectronic device 10. For example, a plurality of contacts 12 can be exposed at a contact-bearing surface of a semiconductor die and may be arranged in one or more rows exposed at such surface.

For ease of reference, directions are stated in this disclosure with reference to a "top", i.e., contact-bearing surface 28 of a semiconductor chip or microelectronic device 10. Generally, directions referred to as "upward" or "rising from" shall refer to the direction orthogonal and away from the microelectronic device top surface 28. Directions referred to as "downward" shall refer to the directions orthogonal to the device top surface 128 and opposite the upward direction. A "vertical" direction shall refer to a direction orthogonal to the chip top surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction. It is to be further appreciated that like reference numerals will be used to describe like elements.

The wires 65,68 typically are not individually insulated, such as by insulating sheaths thereon. As seen in FIG. 1, typically such wires 65,68 are bonded to microelectronic device 10, conductive plane 60, and to interconnection element 30 using conventional wirebonding techniques. In one embodiment, wires 65,68 may be typical of the types of wires used in a conventional wirebonding process. For example, wires 65,68 may consist essentially of copper, gold, a gold-silver alloy, or some other metal or alloy of a metal with one or more other metals or materials or an alloy of a metal with one or more other metals and one or more other materials.

Wirebonds can be formed with relatively precise placement and within desirable tolerances such that parallel, closely spaced runs can be achieved which run parallel to the surface 28 of the conductive plane 60. As used herein, "parallel" denotes a structure which is parallel to another structure within manufacturing tolerances. For example, wirebonding equipment available from Kulicke and Soffa can be used to achieve precision wirebonds. Thus, device wires 65 can be formed which have runs which are perfectly straight in lateral directions above the chip surface 28 and conductive plane 60 or are close to being straight. While such precision can be achieved in forming the wirebonds, nothing is meant to require precisely formed parallel, straight wirebonds other than as specifically recited in the appended claims.

In one embodiment, the conductive plane 60 overlies the microelectronic device 10 and may be positioned between the microelectronic device 10 and wires 65. The conductive plane 60 can be formed and attached to the microelectronic device 10 by any means known in the art. In one embodiment, the conductive plane may be laminated onto the surface of the microelectronic device 10. For example, the conductive plane 60 can be provided by pre-processing a metal sheet such as a copper foil, for example, to form openings 64 in the metal sheet. Then, the metal sheet can be bonded to the surface 28 of the microelectronic device, such as by using an adhesive 62. Alternatively, it may also be formed and attached to the surface of the microelectronic device by processing applied to the surface 28 of a microelectronic device 10 such as a metal deposition or plating process applied to the device while the device is in the form of a wafer or panel containing a plurality of connected devices or after the device has been singulated from other such devices.

In one embodiment, dimensions of the conductive plane in directions oriented horizontally with respect to the surface 28 of microelectronic device 10 can be smaller than corresponding dimensions of the microelectronic device surface 28. As seen in FIGS. 1-1A, the surface 28 of the microelectronic device has a first dimension 26 extending in a first direction and has a second dimension 34 extending in a second direction that is transverse to the first direction. The first and second directions extend horizontally with respect to the microelectronic device surface 28, that is, in directions along such surface. In such embodiment, the conductive layer 60 can have a dimension 26 in the first direction which is smaller than the corresponding first dimension 24 of the microelectronic device surface 28. Similarly, the conductive layer 60 can have a dimension 36 in the second direction which is smaller than the corresponding second dimension 34 of the microelectronic device surface 28.

A first set of wirebonds 65, also referred to hereinafter as "device wires" or "wires" connect the contacts 12 of the microelectronic device 10 with contacts 75 on the interconnection element 30. As seen in FIG. 1, the device wires 65 have portions which are raised above the surface 28 of the conductive plane 60. These portions of the device wire 65 can extend in a horizontal direction parallel to or at least generally parallel to the surface of the conductive plane 60, as shown in FIG. 1. The portions may be parallel within manufacturing tolerances therefor.

In one embodiment, substantial portions x (FIG. 1) of each of the respective wirebonds, for example, 25% or more of the lengths of the respective wirebonds, or each of the lengths of the substantial portions of the respective wirebonds being at least 1 millimeter, are disposed at a substantially uniform distance or height y (FIG. 1) from the conductive plane 60. In one embodiment, the height of the wirebonds from the conductive plane is set to between about 50 micrometers from the surface 28 of the microelectronic element and about 100 micrometers from the surface 28. The height from the conductive plane at which the device wires extend can be selected to achieve desired impedance for carrying signals on the device wires. As discussed below relative to FIG. 1C, the height selected is based on a combination of factors such as the thickness of each wire, and the permeability of the dielectric material between the wire and the conductive plane.

When the device wires are disposed in such relationship with a reference conductor such as conductive plane 60, signals to and from the microelectronic device may be transmitted with less noise entering the connections (e.g., wirebonds) carrying the signals. Each wirebond and the conductive plane, being tied to a source of reference voltage, form a transmission line structure that has a desired characteristic impedance.

In order to achieve a desired characteristic impedance, parameters can be selected such as the conductive properties of the metal used in the wire, as well as the shape and thickness of the wire, the thickness of the insulating material 50 between the wire and the conductive layer 60, the dielectric constant of the insulating material, i.e., permeability.

FIG. 1C graphs characteristic impedance Z0, in ohms, versus separation distance, in inches, between a signal conductor or conductive element, e.g., a wire of cylindrical cross-section or a trace, and a reference conductor or conductive element, e.g., "ground plane." The reference conductor is assumed to be a planar structure that is large in comparison with the diameter of the signal conductor. FIG. 1B plots characteristic impedance for two different diameter wires. The plots in FIG. 1B can be derived from an equation that governs characteristic impedance in an arrangement having the present geometry. In such equation, the characteristic impedance Z0 is given by $$Z_0 = \frac{138 \times \log(4H/d)}{\sqrt{\varepsilon_R}} \text{ ohms,}$$

where H is the separation distance between the wire and the conductive plane, d is the diameter of the wire and $\varepsilon_R$ is the permeability of the dielectric material that separates the wire from the conductive plane. The permeability $\varepsilon_R$ can vary depending on the type of dielectric material used. The separation distance H is a factor which can be at least partly determined by the process used to fabricate the microelectronic assembly. The wire diameter may be at least partly determined by the process used to fabricate the microelectronic assembly.

In FIG. 1C, the lower curve 320 plots the characteristic impedance when the wire used to form a wirebond has a thickness of 1 mil, i.e., 0.001 inch. The upper curve plots 322 the characteristic impedance when the wire used to form the wirebond has a thickness of 0.7 mil, i.e., 0.0007 inch. As seen in FIG. 1C, characteristic impedances lower than about 70 ohms are provided when a separation distance H between the wire and the conductive plane is less than or equal to about 0.002 inch (2 mils), i.e., about 50 microns. Accordingly, through appropriate selection of wire diameter and separation distance, it is possible to obtain any desired characteristic impedance, for example, from 40 ohms to 100 ohms, although characteristic impedances beyond this range are also possible. Thus, a characteristic impedance of 50 ohms can be obtained using the principles of the invention.

As shown in FIGS. 1 and 1A, in preferred embodiments, at least one reference wire 68 directly connects the conductive plane 60 to a reference contact 77 on the interconnection element. In one embodiment, the reference wires 68 are connected to the conductive plane 60 at a point adjacent the outer edge 57 of the conductive plane 60. At least one of the reference wires 68 connects the surface conductor 60 with a source of reference potential (not shown).

As shown in FIG. 1A, at least one reference wire 68A may extend directly from the top surface 14 of the conductive plane 60 and extend in a direction transverse to the direction of the device wires 65 connecting the device contacts 12 with the contacts 75 on the interconnection element 30. Alternatively, one or more reference wires 68B, 68C may extend in a direction parallel to the device wires 65 that connect the device contacts 12 with contacts 75 on the interconnection element 30. In yet another alternate arrangement, at least one reference wire 68C may be positioned between two of the device wires 65. Similarly, the reference wire 68B may only be adjacent one device wire 65, such as adjacent one corner of the conductive plane 60 and a corner of microelectronic device 10, where two adjacent edges of the conductive plane 60 meet, and two edges of the microelectronic device 10 meet. It is to be appreciated that any of the foregoing arrangements alone or in combination with one another, as well as any other arrangement of a reference wire 68 extending from the conductive plane 60, may be used to provide an electrical connection between the conductive plane 60 and a reference contact 77, a source of reference potential (not shown), or some other conductive contact or region that is internal or external to the microelectronic assembly 100.

As seen in FIG. 1, in one embodiment, once the wires 65, 68 have been wirebonded to microelectronic device 10 and interconnection element 30, and/or conductive plane 60, a dielectric material 50 can be formed to cover and protect the wires 65,68. The dielectric 50 in this case might be one of a number of different materials such as a polymer, e.g., an epoxy, or another dielectric material, etc. In one embodiment, dielectric material 50 fills the entire void between the wires 65,68 and the surfaces of the interconnection element 30 and microelectronic device 10.

As best seen in FIG. 1, terminals 40 of the microelectronic assembly 100 may be used to connect the microelectronic assembly 100 to a circuit board or external device (not shown), such as through solder balls 42, which can be attached to the terminals 40 and extend away from a surface 52 of the interconnection element 30 remote from a surface 33 above which microelectronic device 10 is mounted. Terminals can be provided which have other forms than that depicted in FIG. 1, and can be or include, for example, substantially rigid conductive posts such as formed by etching or plating a metal layer, e.g., copper, or a combination of etching and plating steps. Alternatively, the terminals can be in the form of any other known terminal structures which are capable of being used in microelectronic packages or assemblies for electrically connecting such packages or assemblies to a circuit panel, test board or the like.

Figure 2:
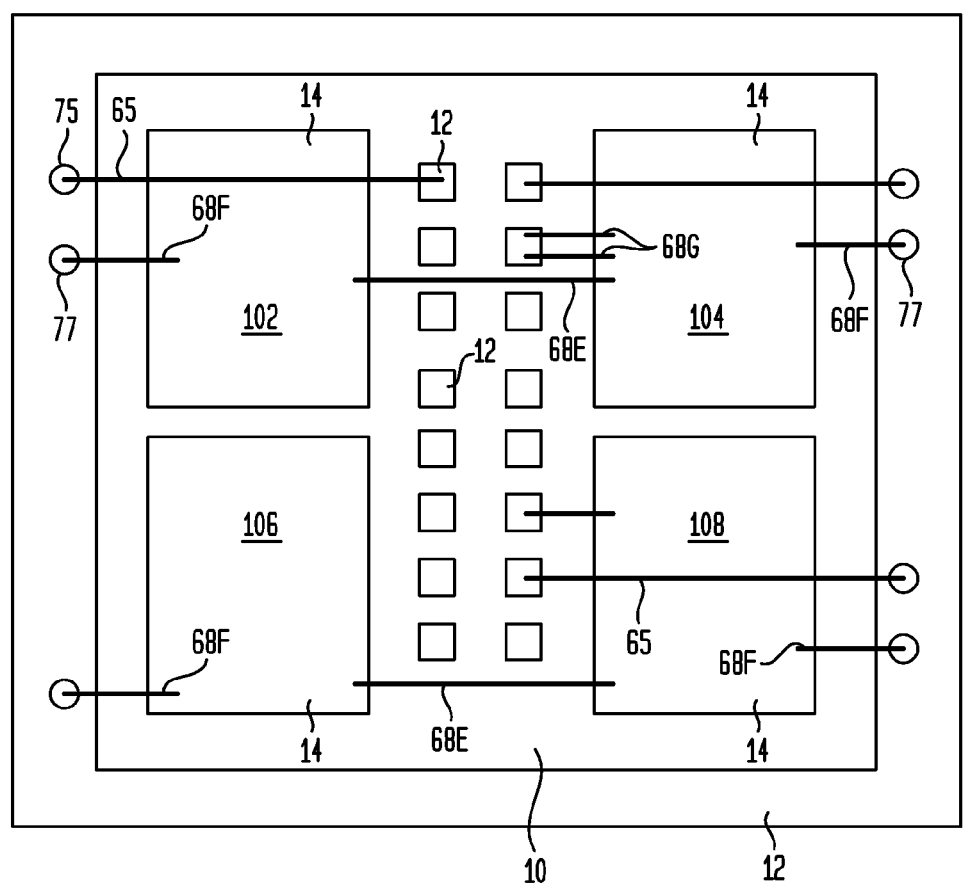
FIG. 2 is a plan view of an alternate embodiment of the microelectronic assembly shown in FIGS. 1 and 1B.

Referring now to the alternative embodiment of FIG. 2, such variation demonstrates that it is not necessary for the conductive plane 60 to be a continuous and intact metal sheet. Instead, as seen in FIG. 2, the conductive layer 60 can be provided in the form of multiple planes overlying the microelectronic device 10. In one embodiment, the conductive plane 60 may be divided into four conductive plane portions 102,104,106,108. As shown, device contacts 12 may extend between the conductive plane portions 102,104 and conductive plane portions 106,108. The four conductive plane portions 102,104,106,108 are physically separated from one another, such that standing alone (i.e., without any bonds connecting the conductive planes to a source of power), each of the conductive plane portions 102,104,106,108 is electrically insulated from one another.

As in the previous embodiments, device wires 65 may extend between the device contact 12 and element contacts 77 on the interconnection element 12. Additionally, reference wires 68 may extend as wirebonds from any of the conductive plane portions 102,104,106,108 to another device or contact internal or external to the microelectronic assembly 200. In the embodiment shown, reference wires 68E may extend between two conductive plane portions to help ensure that both conductive plane portions remain at a stable voltage despite temporary fluctuations in power demand or other transient effects. For example, reference wire 68E electrically connects conductive plane portion 102 and conductive plane portion 104, and reference wire 68E electrically connects conductive plane portions 106,108. Reference wires 68F may also electrically connect conductive plane portions 102,104, 106,108 to respective reference contacts 77 on the interconnection element 30. One or more reference wires 68G may also extend between any of the conductive plane portions to a device contact 12. For example, as shown, a reference wire electrically connects a conductive plane portion 104 with a reference contact 77. In one embodiment, multiple reference wires 68G may extend between a conductive plane portion (e.g., conductive plane portion 104, as shown) and a single device contact 12.

In the exemplary embodiment shown, conductive plane portions 102,104 are ground planes and conductive plane portions 106,108 are power planes. The conductive plane portions 102,104 which are ground planes may be electrically connected to device contacts 12 serving as a ground reference therefor, and a ground reference contact 77 of the substrate, and to one another. Further connection of the ground planes 102,104 to a reference potential such as a system ground reference can be provided through terminals 40 of the microelectronic assembly 100 (FIG. 1). The conductive plane portions 102,104 which are power planes, may be electrically connected to particular device contacts 12 of the microelectronic device to which a voltage input other than ground is required, such as for connecting a power supply input. The power planes can also be electrically connected with one or more corresponding reference contacts 77 on the interconnection element and to one another. Further connection of the power planes 106,108 to a reference potential such as a power supply can be provided through terminals 40 of the microelectronic assembly 100 (FIG. 1). Alternatively, instead of providing ground planes and power planes, all four conductive plane portions 102,104,106,108 may serve as ground plane portions and be connected to ground device contacts 12 and ground reference contacts 77.

Figure 3:
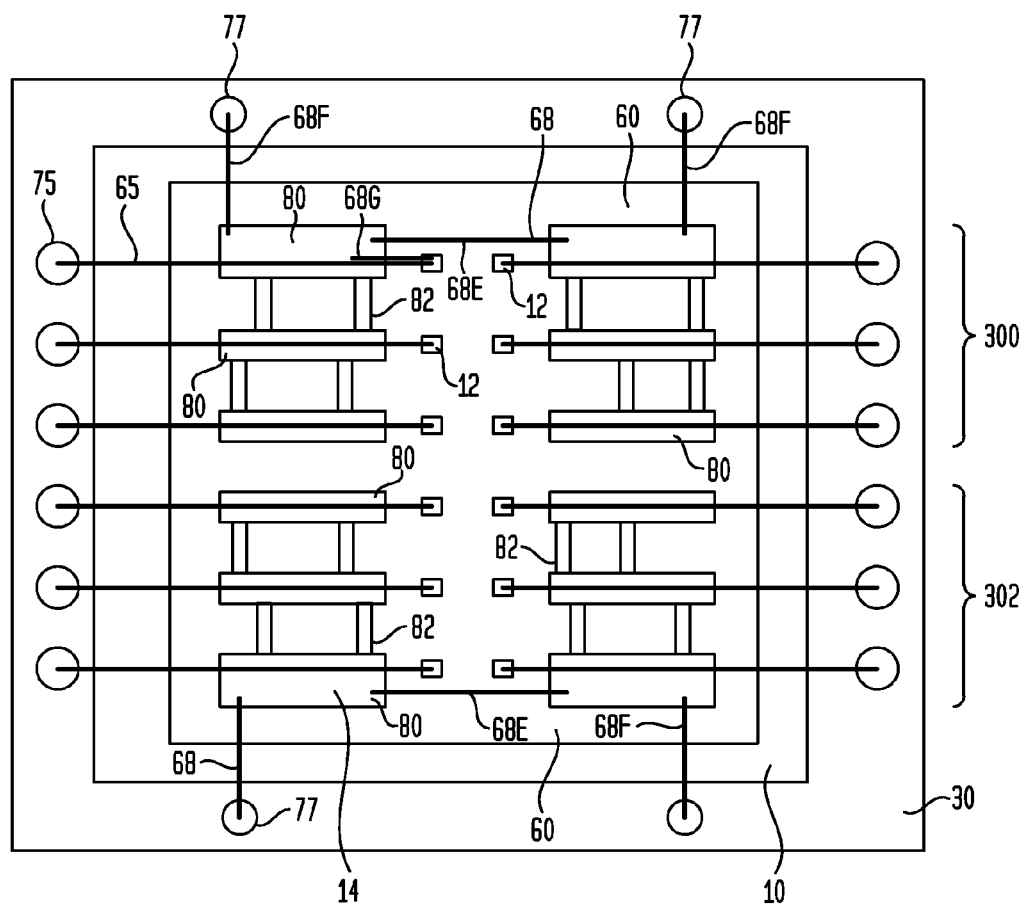
FIG. 3 is a plan view of another alternate embodiment of the microelectronic assembly shown in FIGS. 1 and 1B.

Referring to FIG. 3, there is shown a top view of an alternative embodiment of a microelectronic assembly. Instead of larger multiple planes or sections, the conductive plane 60 may be in the form of a plurality of conductive strips 80 which extend along the surface of the microelectronic device 10 in directions parallel to runs of the device wire 65 between the device contacts 12 and the contacts 75 of the interconnection element 30. The conductive strips 80 can be mechanically supported or held together with supporting portions 82. In one embodiment, the conductive strips and supporting portions are formed as a metallic structure by subtractively patterning a copper foil or sheet and bonding the remaining metallic structure to the surface 128 of the microelectronic device, such as with an adhesive material 62.

In the embodiment shown, the conductive strips 80 are divided into two primary portions, a first upper portion 300 and a second lower portion 302. As shown, there are no supporting portions 82 extending between the first upper portion 300 and second lower portion 302, such that there is a natural division between the first upper portion 300 and second lower portion 302. As in the previous embodiments, reference wires 68E may extend between two conductive strips 80 in the first upper portion 300. Additionally, a reference wire 68F may extend from the conductive plane 80 in the first upper portion 300 to a reference contact 77 on the interconnection element 30. Similarly, reference wires 68E may extend between two conductive strips 80 in the second lower portion 302, as well as extend from the conductive strip 80 in the second lower portion 302 to a reference contact 77 on the interconnection element 30. Additionally, a reference wire 68G may extend from one of the conductive strips 82 to a contact 12 on the microelectronic device 10.

The foregoing embodiments have been described with respect to the interconnection of individual microelectronic devices, e.g., semiconductor chips. However, it is contemplated that the methods described herein may be employed in a wafer-scale manufacturing process applied simultaneously to a plurality of chips connected together at edges of the chips, such as a plurality of chips connected together at edges in form of a unit, panel, wafer or portion of a wafer.

Figure 4:
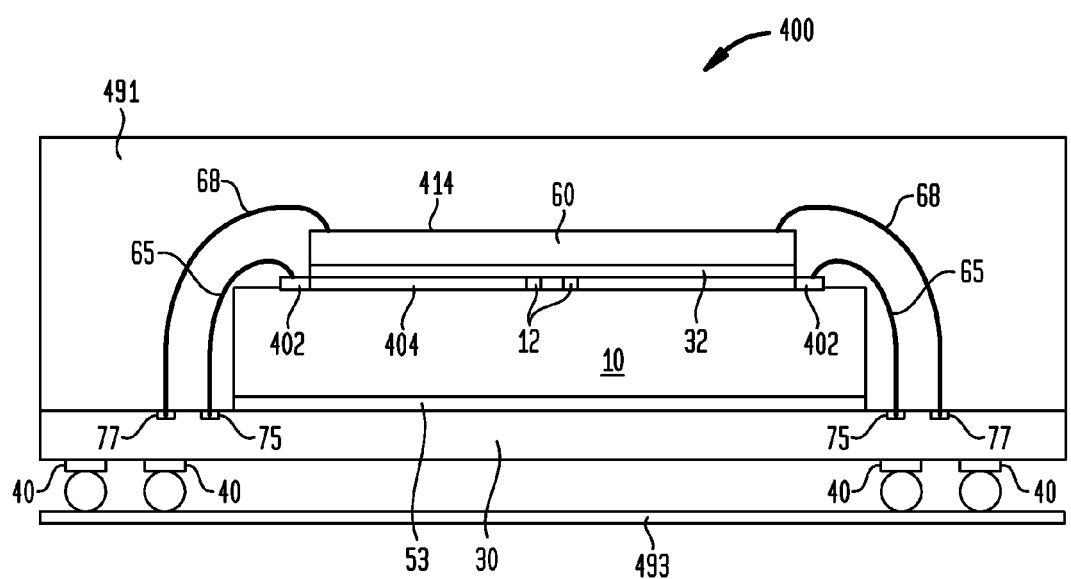
FIG. 4 is a sectional view of a microelectronic assembly in accordance with another embodiment of the presently disclosed invention.
Figure 4A:
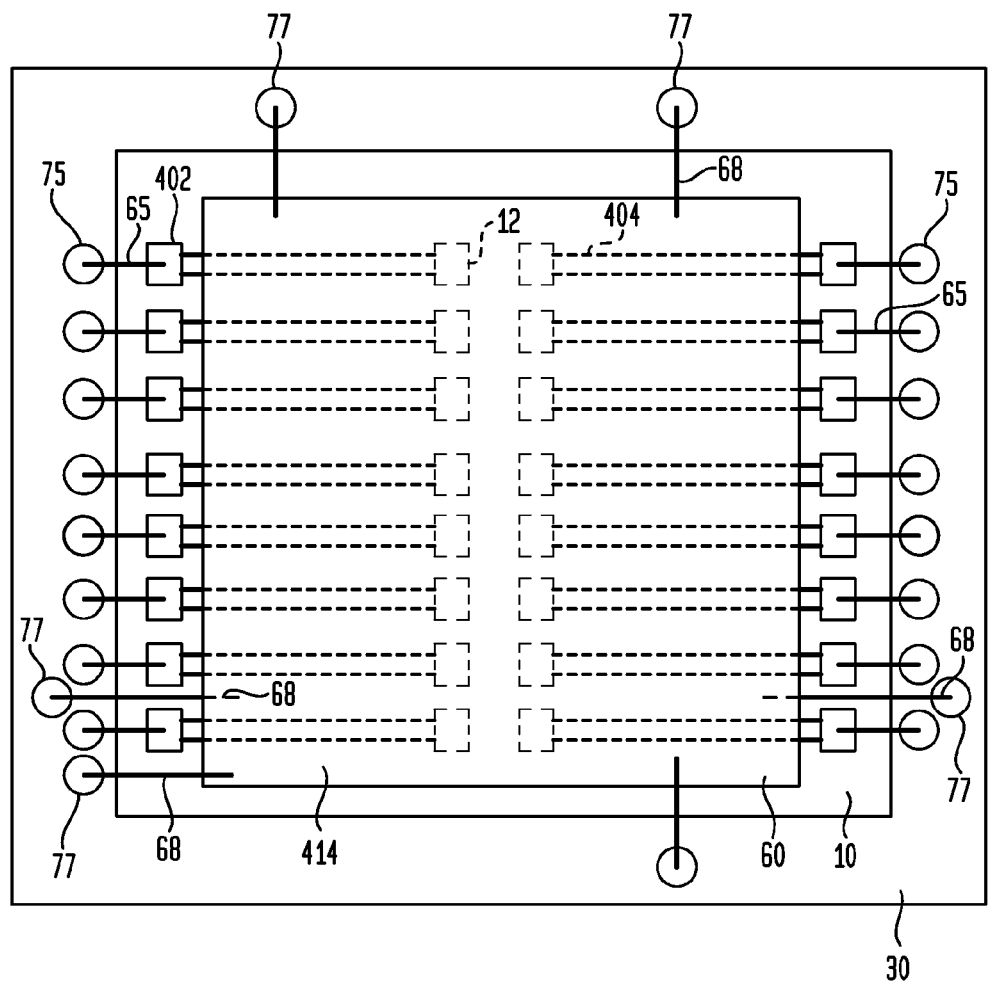
FIG. 4A is a plan view of the microelectronic assembly shown in FIG. 4.

Turning now to FIG. 4, a sectional view is shown illustrating a microelectronic assembly 400 including microelectronic device 10 and conductive plane 60 electrically connected to an interconnection element 30. FIG. 4A is a plan view from above the top surface 414 of the conductive plane 60 and looking toward the surface of the conductive plane 60. As seen in FIG. 4A, the conductive plane 60 is a continuous sheet of conductive material that overlies the top surface 28 of the microelectronic device 10. The conductive plane 60 may be comprised of materials as previously disclosed herein.

As shown, the microelectronic device 10 may be bonded to the interconnection element 30 using known bonding materials, such as a dielectric adhesive 53. The conductive plane 60 may be directly attached or bonded to the microelectronic element 10 through a lamination process or other known processes, as previously described. The conductive plane 60 is positioned to overlie the microelectronic device 10, as well as traces 404 extending along the surface of the microelectronic device 10.

The traces 404 may be formed on the microelectronic device 10 by any suitable metal deposition technique. The traces 404 may be formed by depositing a primary metal layer, e.g., by sputtering, electroless deposition, etc. The primary metal layer can then be photolithographically patterned into separate traces 404, followed by electroplating to increase the thickness of the traces and if desired, form traces 404 having multiple different metal layers. Alternatively, the traces 404 may be formed from a metal layer deposited on the surface of the microelectronic device 10, which can then be selectively patterned using a subtractive process, such as etching. It is to be appreciated that it is preferable for the formation of the traces 404 to occur while the microelectronic device 10 is in its wafer form.

Device contacts 12 (shown in hidden line in FIG. 4A) are positioned along a central portion of the microelectronic device 10. The redistribution contacts 402 are exposed between peripheral edges 410 of the microelectronic device 10 and the outer edge 412 of the conductive plane 60. As shown, the traces 404 on the microelectronic device 10 provide an electrical connection between the redistribution contacts 402 and the device contacts 12. Device wires 65 extend beyond the edge of the microelectronic device 10 to further electrically connect the redistribution contacts 402 with element contacts 75 on the interconnection element 30. This provides for an electrical connection between the microelectronic device 10 and the interconnection element 30 without requiring substantial lengths of the wires to extend across the top surface 414 of the conductive plane 60, as disclosed in the previous embodiments.

In this embodiment, substantial lengths of the traces 404 extend between and substantially parallel to the microelectronic device 10 and conductive plane 60. As the conductive plane 60 is a fixed height above the traces (and the traces 404 a fixed height below the conductive plane 60), a desired impedance can be obtained from this arrangement, based on the principles previously explained herein.

Reference wires 68 may extend from the conductive plane 60 to reference contacts 77 on the interconnection element 30. The reference wires 68 may be further connected to a source of reference potential such as ground or a power supply input terminal of the microelectronic assembly 400.

Figure 4B:
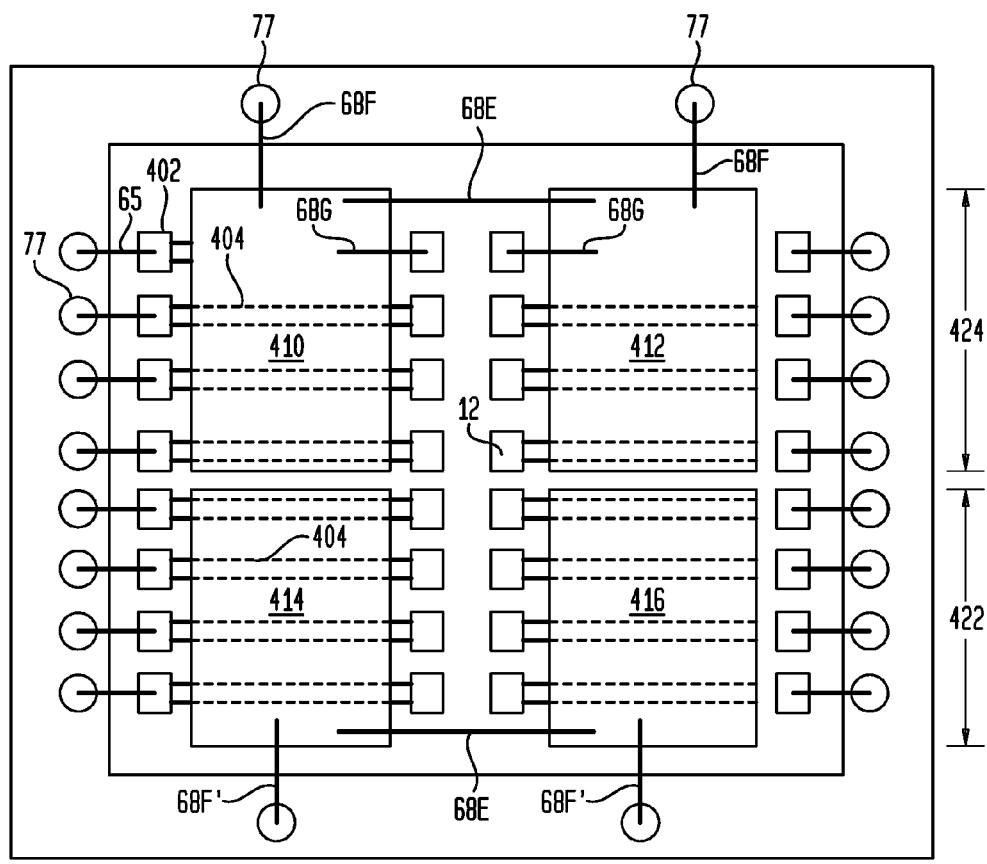
FIG. 4B is a plan view of an alternate embodiment of the microelectronic assembly shown in FIG. 4

Referring to FIG. 4B, an alternate embodiment is shown that only differs from the prior embodiment to the extent that the conductive plane 60 is not one continuous plane. In this embodiment, the conductive plane 60 may include multiple conductive plane portions 410,412,414,416 overlying the traces 404 and microelectronic device.

As shown, the device contacts 12 respectively extend between conductive plane portion 410 and conductive plane portion 412, as well as between conductive plane portion 414 and conductive plane portion 416. Traces 404 extend substantially parallel to the conductive plane portions 410,412,414, 416 and microelectronic device 10. Since the substantial lengths of the traces 404 extend a substantially constant distance from the conductive plane portions 410, 412, 414, and 416, a desired impedance can be obtained in accordance with previously discussed principles.

The conductive plane portions 410,412, may be ground planes and the conductive plane portions 414,416 may be power planes. As in the previous embodiments, there are numerous variations as to how the conductive portions 410, 412,414,416 are connected to each other, reference contacts 77 on the interconnection element, or contacts 12 on the microelectronic device. In one embodiment, at least one reference wire 68F can extend from the ground conductive plane portions 410,412 to a reference contact 77 on the interconnection element 30. Another reference wire 68F' can also extend from the power plane portions 414,416 to a reference contact 77 on the interconnection element 30. Additionally, at least one reference wire 68E can extend between the two conductive plane portions. For example, in one embodiment, reference wire 68E electrically connects the ground conductive plane portion 410 and ground conductive plane portion 412. Similarly, reference wire 68E electrically connects the ground conductive plane portion 410 and ground conductive plane portion 412. Furthermore, at least one reference wire 68G can connect a conductive plane portion 414 or 412, with a contact 12 on the microelectronic device. It is to be appreciated that any combination of the foregoing may be utilized in connection with the present embodiments. In one embodiment, an encapsulant 491 can be deposited around the microelectronic device 10, conductive plane 60, and wires 65,68. The microelectronic assembly 400 can then be connected via terminals 40, such as conductive pins or solder ball connections, to the contacts 489 of a circuit board 493 or other external device.

Figure 5:
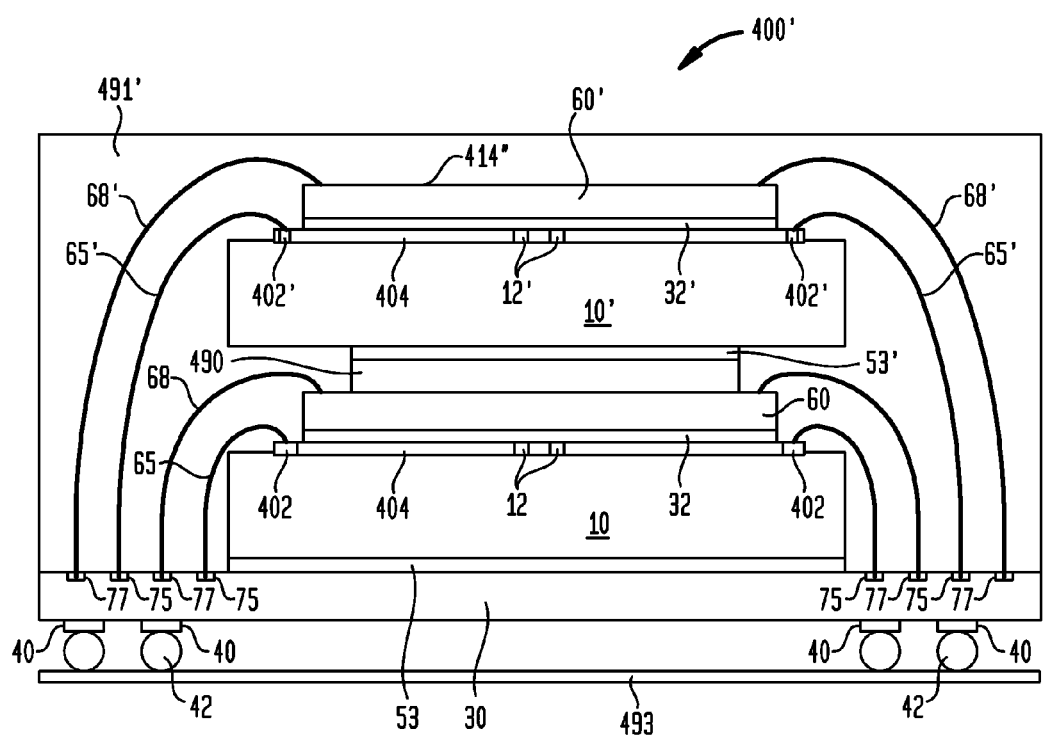
FIG. 5 is a sectional view of an alternate embodiment of the microelectronic assembly shown in FIG. 4.

Referring now to FIG. 5, a microelectronic assembly 400' according to a further embodiment is shown. In one embodiment, a second microelectronic device 10' and second conductive plane 60' are added in a stacked arrangement to the microelectronic assembly 400 shown in FIG. 4. A spacer 490 may be positioned over the first conductive plane 414 to provide a support for the second microelectronic device 10' and second conductive plane 60'. In one embodiment, the spacer 490 has a height needed to provide enough clearance for the wires 65, 68 to extend from the first microelectronic device 10 and first conductive plane 60 to the reference contacts 77 and signal contacts 75, without contacting a surface of the second microelectronic device 10'.

As shown, the second microelectronic device 10' and second conductive plane 60' are electrically connected to the interconnection element 30 in the same arrangement as the first microelectronic assembly 400 shown in FIG. 4. Traces 404' extending along the top surface 28' of the microelectronic device 10' electrically connect the device contacts 12 on the surface of the microelectronic device 10' with the redistribution contacts 402' also exposed thereat. Signal wires 65' extend from the redistribution contacts 402' to signal contacts 75 on the interconnection element. Similarly, reference wires 68' extend from the conductive plane 60' to reference contacts 77 on the interconnection element 30. So as not to interfere with the wires 65,68 extending from the first microelectronic assembly, the wires 65',68' extending from the redistribution contacts on the microelectronic device and the conductive plane extend to contacts positioned adjacent the device and reference contacts 75,77 to which the lower assembly 400 is electrically connected. As further seen in FIG. 5, a dielectric material 491' such as an encapsulant or an overmold can cover and protect the bond wires 65, 68 and the bond wires 65' 68' extending from the microelectronic devices, and can cover and protect other components within the package such as the microelectronic devices and the conductive planes 60, 60'.

Figure 6:
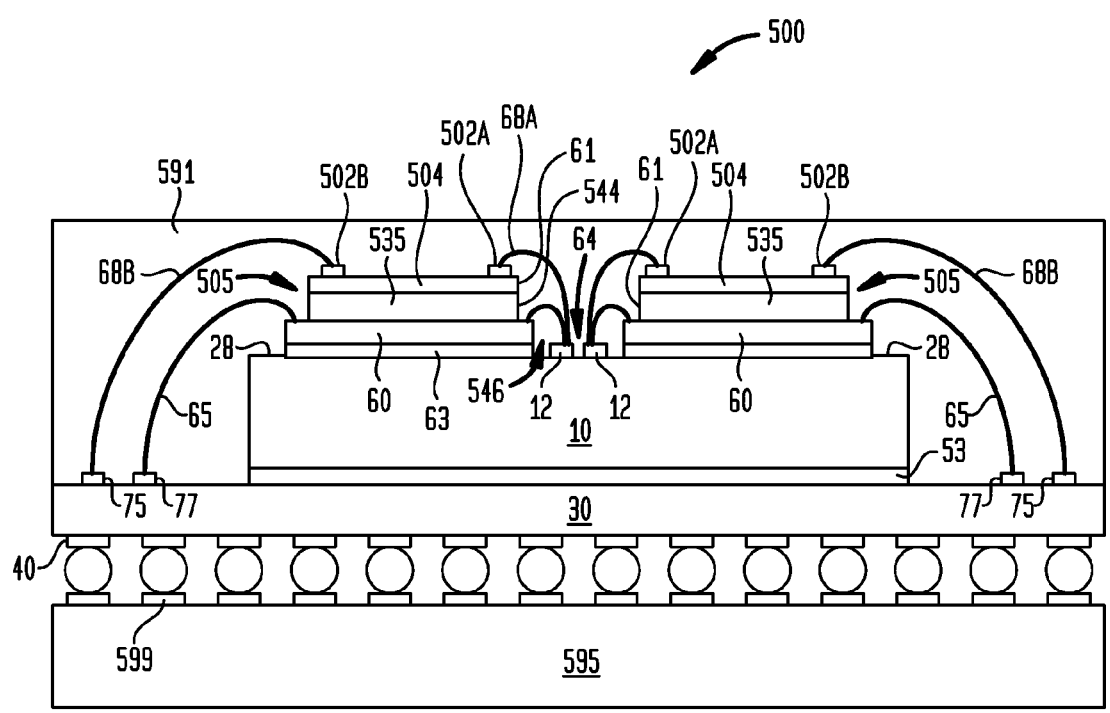
FIG. 6 is a cross-sectional view of an alternative embodiment of the microelectronic assembly in accordance with another embodiment of the presently disclosed invention.
Figure 7:
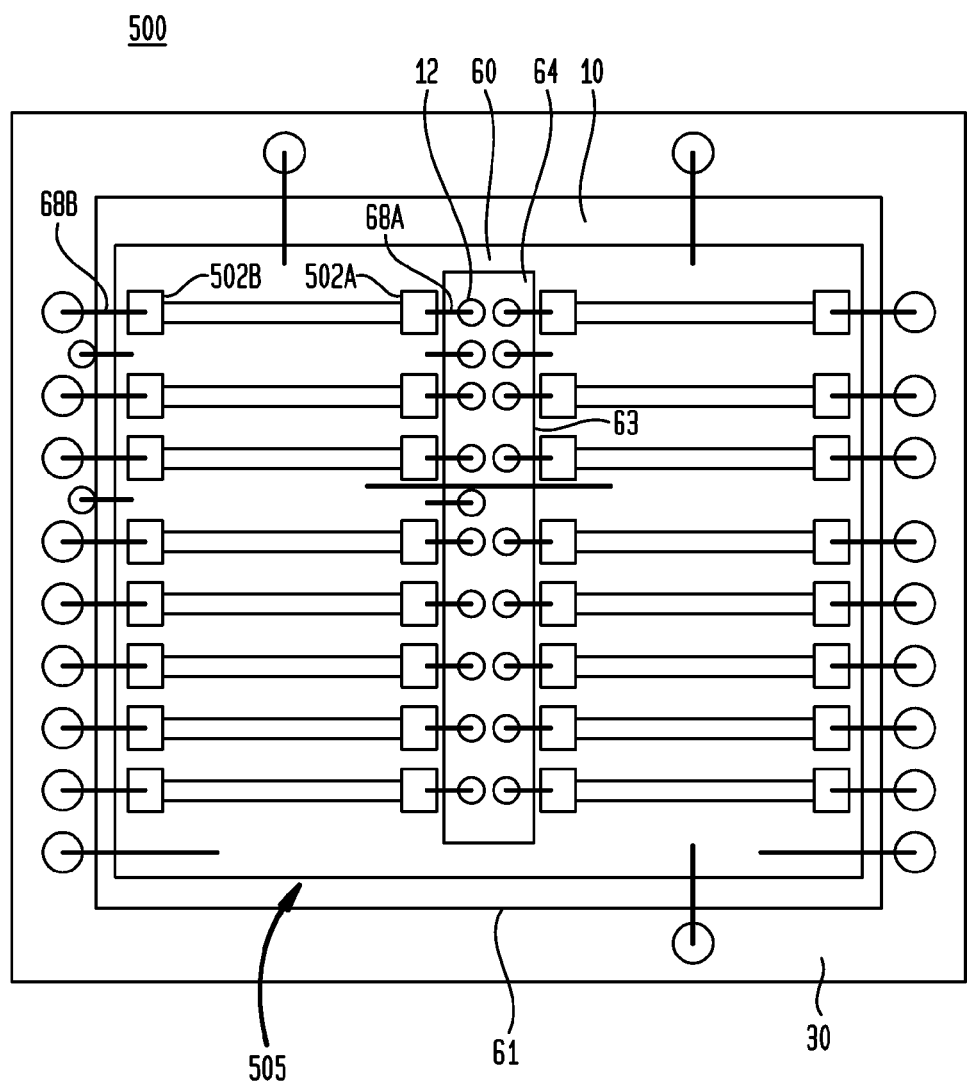
FIG. 7 is a top plan-view of the embodiment shown in FIG. 6.

Turning now to FIGS. 6-7, an alternative microelectronic assembly 500 is shown. Referring first to FIG. 6, a cross-sectional view of the microelectronic assembly 500, the microelectronic assembly 500 includes a microelectronic device 10, an interconnection element 30, and a subassembly 505 overlying the microelectronic device 10 and interconnection element 30. In one embodiment, the subassembly 505 includes an electrically conductive plane 60, an insulating layer 535 and electrically conductive traces 504 overlying the conductive plane 60. The insulating layer 535 typically is made of a dielectric material and may, in some cases, be adhesive. The thickness of the insulating layer 535 can determine the height of the traces 504 above the microelectronic device 10 and the conductive plane 60.

The microelectronic device 10 may be bonded to the interconnection element 30 using known bonding materials, such as a dielectric adhesive 53. The subassembly may be attached or bonded to the microelectronic device 10 using an adhesive layer 63 or B-stage polymer element which is then subsequently cured. In a particular embodiment, the subassembly can be a circuit panel fabricated according to typical circuit panel fabrication techniques. In particular examples, the dielectric layer can be made of polymeric material or be a composite material such as glass epoxy, such as FR4 or BT resin materials.

As best seen in FIG. 7, a plan view from above the top surface 514 of the conductive plane 60 and the traces 504 looking toward the surface of the conductive plane 60, the conductive plane may be a continuous sheet of conductive material that overlies the front surface 28 of the microelectronic device 10. The conductive plane 60 may extend to a peripheral edge of the subassembly 505 that bounds the subassembly 505. There is also an opening 64 within the conductive plane 60, aligned with an opening 544 in the insulating layer 535, whose periphery forms an interior edge 61 of the subassembly 505. Device contacts 12 of the microelectronic device 30 extend beyond the interior edge 61 and are exposed through the opening 64. The conductive plane 60 may be comprised of materials as previously disclosed herein.

Typically, the subassembly is fabricated separately, and then assembled with the microelectronic device to form the assembly 500 shown. In a particular embodiment, the traces 504 may be formed by depositing a primary metal layer, e.g., by sputtering, electroless deposition, etc. The primary metal layer can then be photolithographically patterned into separate traces 504, followed by electroplating to increase the thickness of the traces and, if desired, form traces 504 having multiple different metal layers. Alternatively, the traces 504 may be formed from a metal layer deposited on the surface of the conductive plane 60, which can then be selectively patterned using a subtractive process, such as etching. It is to be appreciated that it is preferable for the formation of the traces 504 to occur while the microelectronic device 10 is in its wafer form.

Device contacts 12 are positioned along a central portion of the microelectronic device 10. As shown, traces 504 on the conductive plane 60 provide an electrical connection between the device contacts 12 and the contacts 75 exposed at the interconnection element 30. Device wires 68A extend from the device contacts 12 to contacts 502A. Device wires 68B extend beyond the edge of the microelectronic device 10 to further electrically connect the contacts 502B with element contacts 75 on the interconnection element 30. This provides for an electrical connection between the microelectronic device and the interconnection element 30 without requiring substantial lengths of the wires to extend across the top surface 514 of the conductive plane 60, as disclosed in the previous embodiments.

In this embodiment, substantial lengths of the traces 504 extend substantially parallel to the microelectronic device and conductive plane 60. As the traces 504 are a fixed height above the conductive plane 60, a desired impedance can be obtained from this arrangement, based on the principles previously explained herein.

Reference wires 65 may extend from the conductive plane 60 to reference contacts 77 on the interconnection element 30. The reference contacts 77 may be further connectable to a source of reference potential such as a ground terminal 40 or a power supply input terminal 40 of the microelectronic assembly 500, as described above.

An encapsulant 591 can be deposited over the traces 504, around the microelectronic device 10, conductive plane 60, device wires, reference wires, and openings. The microelectronic assembly 500 can then be connected via terminals 40 exposed at the interconnection element 30 to contacts 599 of a circuit board 595 or other external device.

Figure 8:
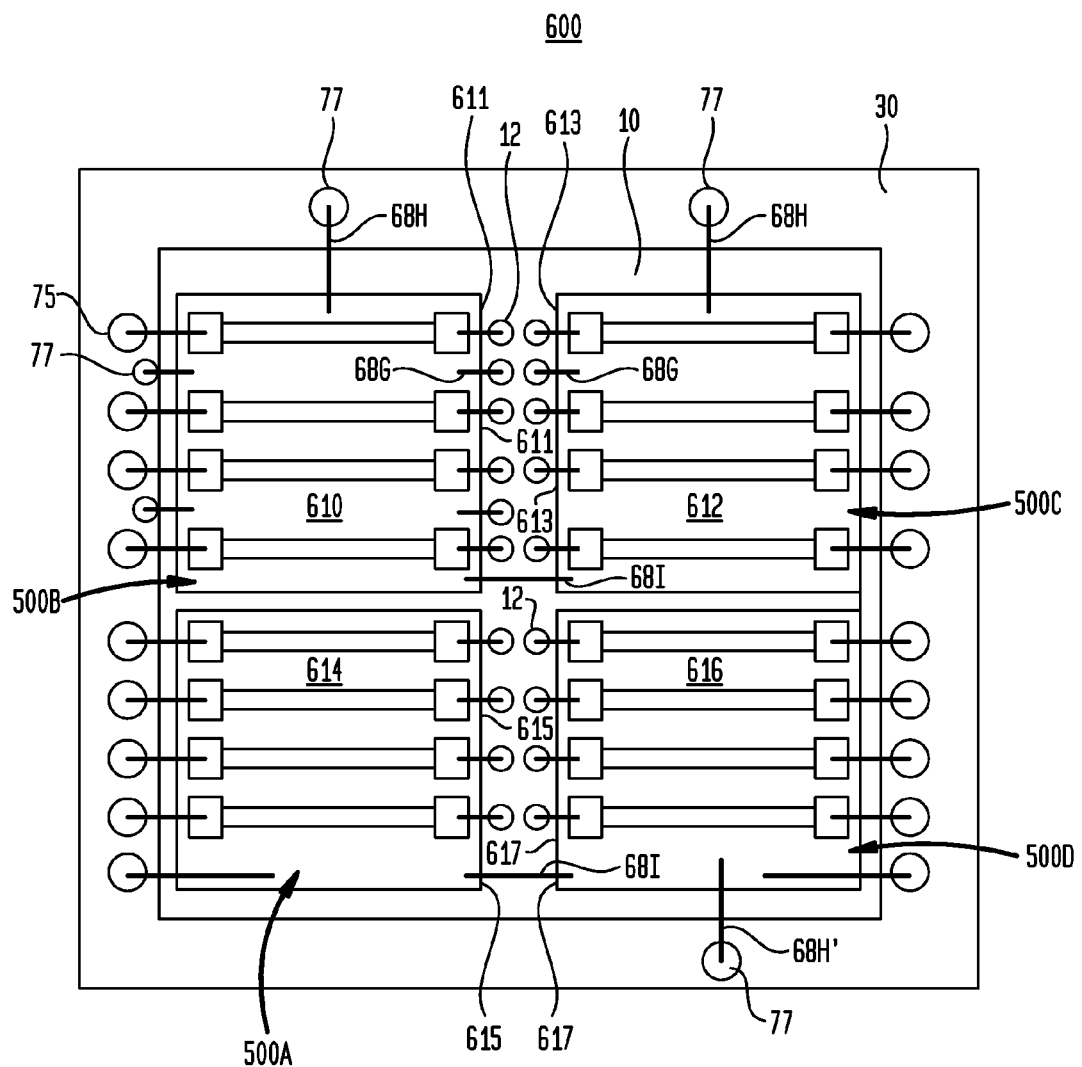
FIG. 8 is an alternative embodiment of the microelectronic assembly shown in FIG. 6.

Referring to FIG. 8, an alternative embodiment is shown that differs from the embodiment of FIGS. 6-7 to the extent that there is more than one conductive plane. In this embodiment, the conductive plane is not one continuous plane, but instead includes four separate conductive plane portions 610, 612, 614, 616 overlying the microelectronic device 10. As a result, there are also four subassemblies 500A-500D, such as those subassemblies previously described herein, each of the four subassemblies 500A-500D including one of the conductive plane portions 610,612,614,616. It is to be appreciated that there can be any number of conductive plane portions, such as two, three, or more than four. Similarly, there can be any number of subassemblies that include such conductive plane portions.

As shown, the device contacts 12 respectively extend between conductive plane portion 610 and conductive plane portion 612, as well as between conductive plane portion 614 and conductive plane portion 616. Therefore, some device contacts 12 are exposed beyond the edges 611 and 613 of conductive plane portions 610 and 612, respectively, and some device contacts 12 are exposed beyond edges 615,617 of plane portions 614,616. Traces 604 extend substantially parallel to the conductive plane portions 610, 612, 614, 616 and microelectronic device 10. Since the substantial lengths of the traces 604 extend a substantially constant distance from the conductive plane portions 610,612,614,616, a desired impedance can be obtained in accordance with previously discussed principles.

In one embodiment, the first and second conductive plane portions 610, 612 may be ground planes and the third and fourth conductive plane portions 614,616 are power planes. The first and third conductive plane portions 610,614 can provide ground and power connections for off-chip drivers, and the second and fourth conductive plane portions 612, 616 can provide ground and power connections for circuitry other than for the off-chip drivers. In such embodiments, the microelectronic device 10 is capable of driving these particular signals towards a circuit board. This is helpful to reduce noise that might otherwise be coupled from the power and ground connections to other circuitry of the chip. Such microelectronic elements may include logic chips, memory chips, e.g., DRAM, or various other types of chips. In this example, off-chip drivers for a DRAM can include data output buffers, data strobes.

As in the previous embodiments, there are numerous variations as to how the conductive portions 610,612,614,616 are connected to each other, as well as element contacts 75 and reference contacts 77 exposed at the interconnection element 30 or contacts 12 exposed at the microelectronic device 10. In one embodiment, at least one reference wire 68H can extend from the ground conductive plane portions 610, 612 to a reference contact 77 on the interconnection element 30. Another reference wire 68H' can also extend from one or both of the power plane portions 614,616 to a reference contact 77 on the interconnection element 30. Additionally, at least one reference wire 68I can extend between the two conductive plane portions. For example, in one embodiment, reference wire 68I electrically connects the ground conductive plane portion 610 and ground conductive plane portion 612. Furthermore, at least one reference wire 68G can connect a conductive plane portion 610 or 612, with a contact 12 on the microelectronic device.

Figure 9:
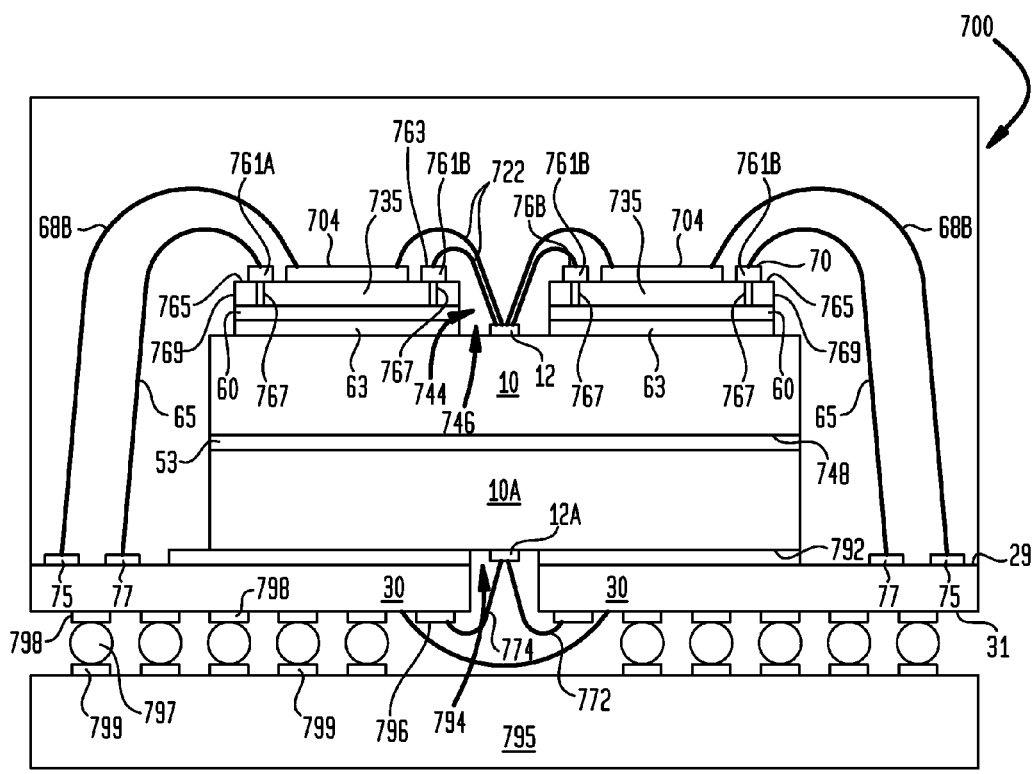
FIG. 9 is a cross-sectional view of an embodiment of the microelectronic assembly in accordance with another embodiment of the presently disclosed invention.

Referring now to FIGS. 9-9B, there is shown a microelectronic assembly 700, an alternative embodiment of FIG. 6. In this example, the presence of an insulating layer 735 with vias 767 can allow the wires that electrically connect the conductive plane 60 to the interconnection element 30 and the microelectronic device 10 to be positioned differently. Referring first to FIG. 9, the microelectronic assembly 700 includes an interconnection element 30, a first microelectronic device 10, a second microelectronic device 10A, a ground plane 60, an insulating layer 735, and traces 704 overlying both insulating layer 735 and conductive plane 60. The first microelectronic device 10 includes a single row of device contacts 12 extending along a central portion of the microelectronic device 10. In this embodiment, traces 704 are positioned at the outermost portion of the assembly 700, so that the traces 704 overlie the insulating layer 735, which, in turn, overlie the conductive plane 60. The insulating layer 735 includes a first opening 744 and the conductive plane 60 includes a second opening 746 that is aligned with the first opening 744.

Figure 9A:
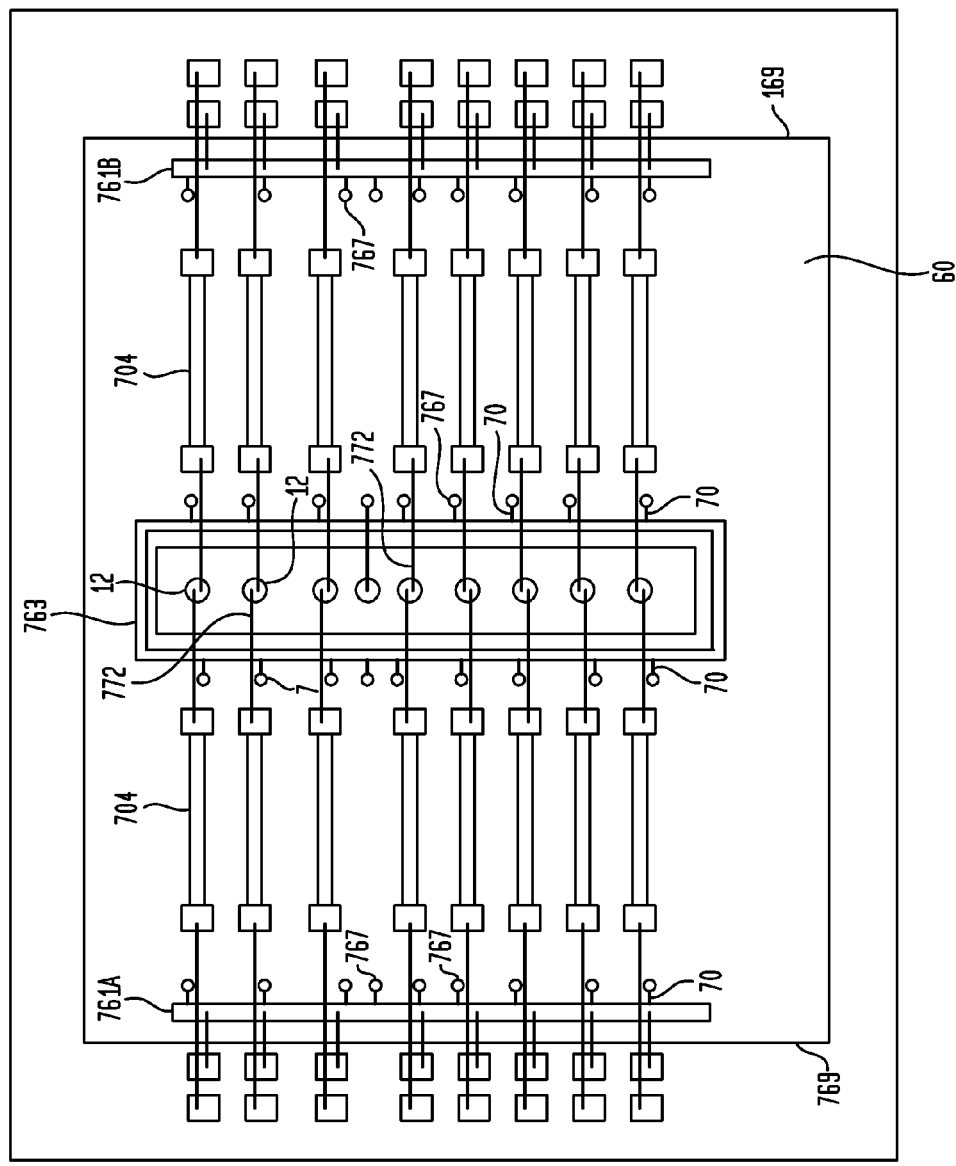
FIG. 9A is a top plan view of the embodiment shown in FIG. 9.

As shown in FIG. 9A, the microelectronic assembly 700 may further include a first ground bar 761A and a second ground bar 761B extending along opposed peripheral edges 769 (FIG. 9) of the insulating layer 735. A ground ring 763 may extend around the first and second openings 744,746.

As shown in FIG. 9A, a plurality of conductive vias 767 may extend through the insulating layer 735. In this embodiment, conductive vias 767 may be formed using conventional methods. In one example, the conductive vias 767 may be lined or filled with a deposited or plated metal such as, for example, copper. Alternatively, any conductive material may line or fill the inner surfaces of the conductive vias 767.

The ground bar 761 may be spaced apart from the conductive vias 767. The ground bar 761 may be an elongated strip of conductive material that extends adjacent the peripheral edges 769 of the conductive plane and is positioned between the conductive vias 767 and opposed peripheral edges 769 of the conductive plane 60. In an alternative embodiment, the conductive vias 767 may instead be positioned closer to the opposed peripheral edges 769 of the insulating layer 735 than the ground bar 761. The conductive vias 767 may also be formed to have a bondable surface at the first surface of the dielectric layer, so as to obviate the need for a ground bar 761 or ground ring 763. A ground ring 763, when present, may be formed similar to the ground bar, the only difference being that the ground ring 763 is in the shape of a ring. Traces 704 may also be used to electrically connect the ground bar 761 and ground ring 763 to the conductive vias 767.

In a particular embodiment, as shown in FIG. 9, microelectronic assembly 700 can also include a second microelectronic device 10A having a rear surface facing a rear surface 748 of the first microelectronic device 10. The rear surfaces of the devices 10,10A may be bonded together using a die attach, adhesive, or other bonding method. In an exemplary embodiment, the front surface 792 of the second microelectronic device 10A faces toward the first surface 29 of interconnection element 30 so that microelectronic device 10A is in a face-down orientation. As best seen in FIG. 9B, the second microelectronic device 10A has a central row of bond pads 12A exposed through an opening 794 in the interconnection element 30. The second microelectronic device 10A can be electrically connected with the interconnection element 30 using wires 772 and can be electrically interconnected with the device 10 through the interconnection element 30 and wires 65. As shown, wires 772 extend through opening 794 in the interconnection element 30 to electrically connect the bond pads 12A exposed at the second microelectronic device 10A with contact pads 796 exposed at the second surface 31 of the interconnection element 30.

As best shown in FIG. 9, all of the wires are connected to the outermost portions of the microelectronic assembly 700. Wires 772 extend from device contacts 12, through the first and second openings in the conductive plane and insulating layer, and to the ground ring 763. Wires 772 extend from device contacts 12, through the first and second openings in the respective conductive plane 60 and insulating layer 735, and to the traces 704 extending along the surface of the conductive plane 60. Similarly, wires 68B extend from the element contacts 75 directly to the traces 704 and wires 65 from the reference contacts 77 on the interconnection element 30 to the ground bar 761A,761B on the insulating layer 735.

Terminals 798 exposed at the interconnection element 30 may be used to electrically connect the interconnection element 30 with another device. In one example, solder balls 797 are used to electrically connect terminals with contacts on a circuit board. A bonding material, such as solder balls, may be used to provide an external connection to contacts 799 of another device, such as a circuit board 795 (see FIG. 9.) or another microelectronic device or the like. It is to be appreciated that any form of connection with another device may be used, such as conductive posts, stud bumps, or the like.

Figure 10:
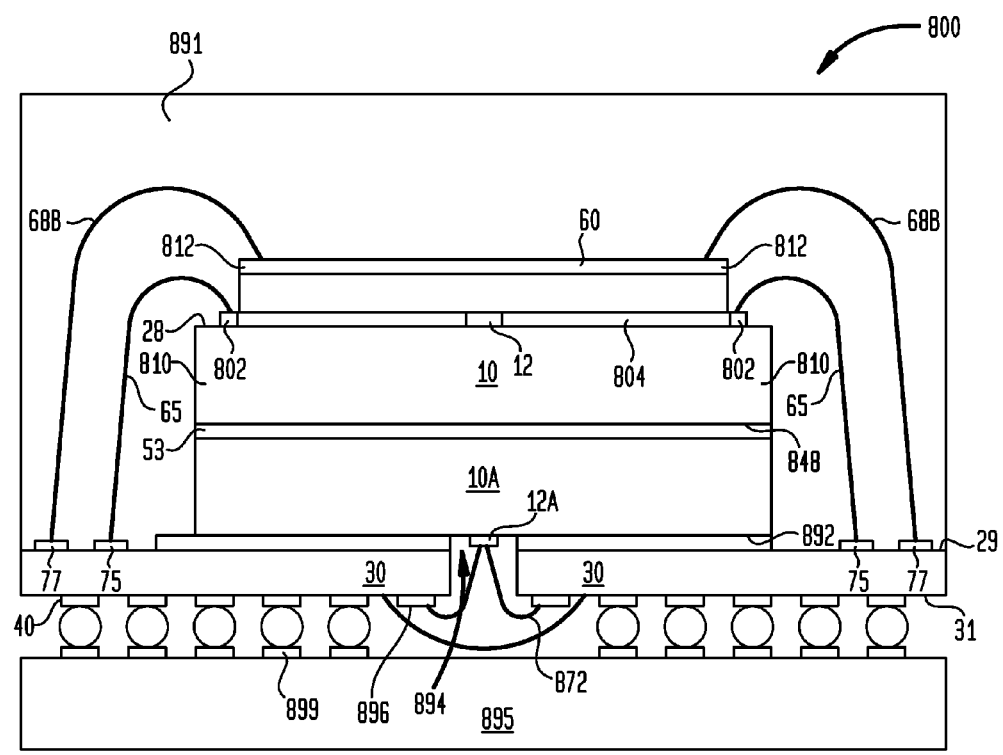
FIG. 10 is a cross-sectional view of an embodiment of the microelectronic assembly in accordance with another embodiment of the presently disclosed invention.

The modifications shown in FIGS. 9, 9A, and 9B to add a second microelectronic device 10A therein can be applied to any of the other embodiments shown and described above relative to FIGS. 1-8. For example, FIG. 10 shows an alternative microelectronic assembly 800. This assembly is as described above relative to FIG. 4, but further includes a second microelectronic element 10A. As previously discussed, to help provide impedance control, the microelectronic assembly can be arranged so as to include traces 804 formed on a first microelectronic device 10 by any suitable metal deposition technique. Conductive plane 60, a continuous sheet of conductive material, overlies the front surface 28 of microelectronic device 10, as well as traces 804 extending along the surface of the microelectronic device 10.

Device contacts 12 are positioned along a central portion of the first microelectronic device 10 and exposed between peripheral edges 810 of the microelectronic device 10 and the outer edge 812 of the conductive plane 60. As shown, traces 804 exposed at the front surface 28 of microelectronic device 10 provide an electrical connection between the contacts 802 and the device contacts 12. Device wires 65 extend beyond the edge of the microelectronic device 10 to further electrically connect the contacts 802 with element contacts 75 on the interconnection element 30. This provides for an electrical connection between the microelectronic device 10 and the interconnection element 30 without requiring substantial lengths of the wires to extend across the top surface 814 of the conductive plane 60, as disclosed in the previous embodiments.

As shown in FIG. 10, a second microelectronic device 10A can be attached to the rear surface 848 of the first microelectronic device 10, such as with a die attach, adhesive or other bonding method. In an exemplary embodiment, the front surface 892 of the second microelectronic device 10A faces a first surface 29 of the interconnection element 30 such that the device 10A is in a face-down orientation. The second microelectronic device 10A has a central row of bond pads 12A exposed through an opening 894 in the interconnection element 30. Bond wires 872 can be used to electrically connect the bond pads 12A and contact pads 896 exposed at the second surface 31 of the interconnection element 30.

An encapsulant 891 can be deposited around the microelectronic device 10, conductive plane 60, bond wires, and openings. The microelectronic assembly 800 can then be connected via terminals 40 exposed at the interconnection element 30 to contacts 899 of a circuit board 895 or other external device.

In this embodiment, substantial lengths of the redistribution traces 804 extend between and substantially parallel to the microelectronic device 10 and conductive plane 60. As the conductive plane 60 is a fixed height above the conductive traces (and the conductive traces 804 a fixed height below the conductive plane 60), a desired impedance can be obtained from this arrangement, based on the principles previously explained herein.

Figure 11:
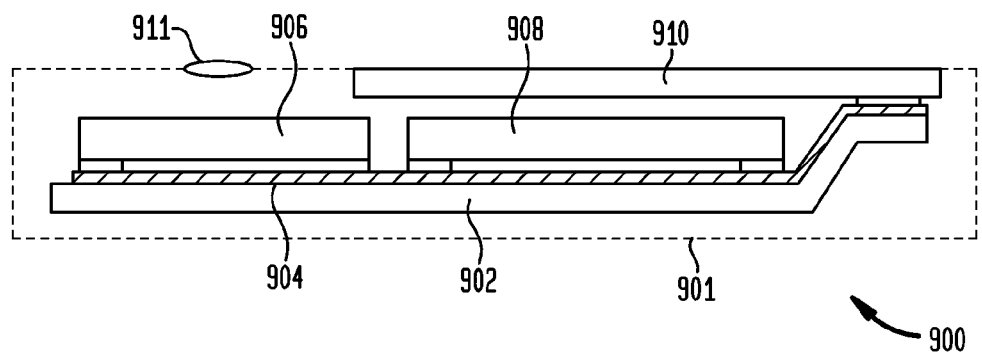
FIG. 11 is a schematic depiction of a system according to one embodiment of the invention.

The various microelectronic assemblies discussed in each of the embodiments above can be utilized in construction of diverse electronic systems. For example, referring to FIG. 11, a system 900 in accordance with a further embodiment of the invention includes a structure 906 as described in the prior embodiments of microelectronic assemblies above in conjunction with other electronic components 908 and 910. In the example depicted, component 908 is a semiconductor chip whereas component 910 is a display screen, but any other components can be used. Of course, although only two additional components are depicted in FIG. 11 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 11, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element, such as an imaging chip, a lens 911 or other optical device also may be provided for routing light to the structure. Again, the simplified system shown in FIG. 11 is merely exemplary; other systems, including systems commonly regarded as fixed structures, such as desktop computers, routers, and the like, can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
   an interconnection element including a dielectric element, a plurality of element contacts and at least one reference contact thereon;
   a microelectronic device having a rear surface overlying the dielectric element, a front surface remote therefrom, device contacts exposed at the front surface;
   a conductive plane overlying a portion of the front surface and insulated therefrom;
   a plurality of traces overlying a surface of the conductive plane and insulated therefrom, the traces being electrically connected with the element contacts, the traces having substantial portions spaced a first height above and extending at least generally parallel to the conductive plane, such that a desired impedance is achieved for the traces; and
   a first bond element electrically connecting the at least one conductive plane with the at least one reference contact, wherein the at least one reference contact is connectable to a source of reference potential;
   a plurality of second bond elements electrically connecting device contacts with the traces.

2. The microelectronic assembly of claim 1, wherein the surface of the conductive plane over which the traces extend is a surface facing away from the front surface of the microelectronic device.

3. The microelectronic assembly of claim 1, wherein the substantial portion of each trace has a length that is at least 25% of the total length of each individual respective trace.

4. The microelectronic assembly of claim 1, wherein the substantial portions of the traces are lengths of at least 1 millimeter.

5. The microelectronic assembly as claimed in claim 1, wherein the conductive plane is a power plane.

6. The microelectronic assembly as claimed in claim 1, wherein the conductive plane is a ground plane.

7. The microelectronic assembly as claimed in claim 1, wherein the conductive plane is comprised of multiple sections, wherein at least a first section is a power plane and a second section is a ground plane.

8. The microelectronic assembly of claim 7, wherein the first section is adjacent one edge of the device contacts and the second section is adjacent the opposed edge of the device contacts.

9. The microelectronic assembly of claim 7, wherein the first and second sections are adjacent the same edge of the device contacts.

10. The microelectronic assembly of claim 7, wherein the first section is comprised of a first portion and a second portion, and the device contacts extend between the first and second portions.

11. The microelectronic assembly of claim 7, wherein the second section is comprised of a first portion and a second portion, and the device contacts extend between the first and second portions.

12. The microelectronic assembly of claim 11, wherein the second section is comprised of a third portion and a fourth portion, and the device contacts extend between the third and fourth portions, wherein the first and second portions of the first conductive plane are ground planes and the third and fourth portions of the second conductive plane are power planes, the first and third portions providing ground and power connections for off-chip drivers, and the second and fourth portions providing ground and power connections for circuitry other than for the off-chip drivers.

13. The microelectronic assembly of claim 12, further comprising at least one third bond element electrically connecting the first and second portions of the second section.

14. The microelectronic assembly of claim 11, further comprising at least one third bond element electrically connecting the first and second portions of the first section.

15. The microelectronic assembly of claim 11 or 12, further comprising at least one third bond element electrically connecting device contacts with the first portion or second portion of at least one of the first section and second sections.

16. The microelectronic assembly of claim 1, wherein the conductive plane is connectable to a fixed voltage source.

17. The microelectronic assembly of claim 1, further comprising at least one third bond element electrically connecting at least one device contact with at least one conductive plane.

18. The microelectronic assembly as claimed in claim 1, further comprising at least one third bond element electrically connecting the conductive plane with a reference contact of the interconnection element.

19. The microelectronic assembly as claimed in claim 1, further comprising an insulating layer positioned between the conductive plane and the plurality of traces, the insulating layer insulating the plurality of traces from the conductive plane.

20. The microelectronic assembly as claimed in claim 19, further comprising conductive vias extending through the insulating layer.

21. The microelectronic assembly as claimed in claim 20, wherein the first bond element is electrically connected to the at least one conductive plane through the conductive vias.

22. The microelectronic assembly as claimed in claim 20, further comprising a ground connection connected to the conductive vias, the first bond element being electrically connected to the at least one conductive plane through the ground connection and conductive vias.

23. The microelectronic assembly as claimed in claim 1, further comprising a second microelectronic device having a rear surface and an opposed front surface with device contacts thereon, the rear surface of the second microelectronic device being adjacent the rear surface of the first microelectronic device, wherein the interconnection element further includes an opening and the device contacts of the second microelectronic device are exposed through the opening.

24. The microelectronic assembly of claim 1, wherein the first bond element is bonded to a surface of the conductive plane that faces away from the front surface of the microelectronic device.

25. The microelectronic assembly of claim 1, wherein the substantial portion of each trace has a length that is at least 25% of the total length of each individual respective trace.

26. The microelectronic assembly of claim 1, wherein the substantial portions of the traces are lengths of at least 1 millimeter.

27. The microelectronic assembly as claimed in claim 1, wherein the conductive plane is a power plane.

28. The microelectronic assembly as claimed in claim 1, wherein the conductive plane is a ground plane.

29. A microelectronic assembly comprising:
an interconnection element including a dielectric element, a plurality of element contacts and at least one reference contact thereon;
a microelectronic device having a rear surface facing the dielectric element, a front surface remote therefrom, and device contacts exposed at the front surface;
a plurality of traces overlying the microelectronic device;
a conductive plane overlying a portion of the traces and insulated therefrom;
a first bond element electrically connecting the at least one conductive plane with the at least one reference contact, wherein the at least one reference contact is connectable to a source of reference potential; and
a plurality of second bond elements electrically connecting the device contacts with the traces,
wherein the traces are electrically connected with the element contacts, and the traces having substantial portions spaced a fixed distance and generally parallel to the conductive plane, such that a desired impedance is achieved for the traces.

30. The microelectronic assembly, as claimed in claim 29 wherein the microelectronic device is a first microelectronic device and the assembly further comprises a second microelectronic device having a front surface facing the substrate and a rear surface facing the rear surface of the first microelectronic device, the microelectronic device having contacts exposed at the front surface thereof.

31. A method of forming a microelectronic assembly comprising:
bonding a subassembly to a front surface of a microelectronic element such that device contacts extending along a central portion of the front surface of the microelectronic element are exposed beyond an edge of the subassembly, the subassembly including a conductive plane, overlying a portion of the front surface of the microeletronic element and insulated therefrom, a plurality of traces overlying the conductive plane, and a dielectric layer positioned between the conductive plane and the plurality of traces;
forming first wirebonds electrically connecting the traces with the device contacts; and
forming second wirebonds electrically connecting the traces with element contacts on an interconnection element disposed below a rear surface of the microelectronic element, the rear surface being opposite the front surface.

32. The method according to claim 31, wherein the edge of the subassembly is a peripheral edge bounding a major surface of the subassembly.

33. The method as claimed in claim 32, wherein the subassembly further includes an aperture through which the device contacts are exposed, wherein the interior edge of the subassembly is an edge of the aperture.

34. The method as claimed in claim 31, wherein the subassembly is a circuit panel.

35. The method as claimed in claim 31, wherein the dielectric layer is selected from a polymeric material or a composite material.

* * * * *